(12) United States Patent
Wang

(10) Patent No.: US 11,060,906 B1
(45) Date of Patent: Jul. 13, 2021

(54) TRANSIMPEDANCE AMPLIFIER WITH AUTOMATIC CURRENT CONTROL

(71) Applicant: Facebook, Inc., Menlo Park, CA (US)

(72) Inventor: Shih-Cheng Wang, Cupertino, CA (US)

(73) Assignee: Facebook, Inc., Menlo Park, CA (US)

( * ) Notice: Subject to any disclaimer, the term of this patent is extended or adjusted under 35 U.S.C. 154(b) by 242 days.

(21) Appl. No.: 15/844,305

(22) Filed: Dec. 15, 2017

Related U.S. Application Data

(60) Provisional application No. 62/439,837, filed on Dec. 28, 2016.

(51) Int. Cl.
| | | |
|---|---|---|
| *G01J 1/44* | (2006.01) | |
| *H03F 1/26* | (2006.01) | |
| *H03F 1/02* | (2006.01) | |
| *H03F 1/30* | (2006.01) | |
| *H03F 3/08* | (2006.01) | |

(Continued)

(52) U.S. Cl.
CPC ............. *G01J 1/44* (2013.01); *H03F 1/0211* (2013.01); *H03F 1/26* (2013.01); *H03F 1/30* (2013.01); *H03F 3/08* (2013.01); *G01J 2001/444* (2013.01); *H03F 2200/171* (2013.01); *H03F 2200/264* (2013.01); *H03F 2200/387* (2013.01);

(Continued)

(58) Field of Classification Search
CPC ..... G01J 1/44; G01J 2001/444; H03F 1/0211; H03F 1/26; H03F 3/08; H03F 1/30; H03F 2200/387; H03F 2200/171; H03F 2200/264; H04B 10/50; H04B 10/11; H04B 10/69
See application file for complete search history.

(56) References Cited

U.S. PATENT DOCUMENTS

| | | | |
|---|---|---|---|
| 6,608,483 B1 * | 8/2003 | Hill | ........................ G01R 29/12 |
| | | | 324/457 |
| 7,539,423 B2 | 5/2009 | Robinson | |

(Continued)

FOREIGN PATENT DOCUMENTS

EP        2819305 A1    12/2014

OTHER PUBLICATIONS

Li, A Photodetecting Device That Rejects Ambient Light, Master's thesis, Oregon State University, 57 pages, Feb. 21, 1997.

(Continued)

*Primary Examiner* — Jennifer D Bennett
(74) *Attorney, Agent, or Firm* — Baker Botts L.L.P.

(57) ABSTRACT

In one embodiment, a method includes receiving, at an input of a transimpedance amplifier, an input electrical-current signal. The electrical-current signal includes a photodetector current and a DC cancellation current. The photodetector current corresponds to an input optical signal and includes an alternating-current (AC) portion and a direct-current (DC) portion. The method also includes performing, by the transimpedance amplifier, a transimpedance amplification of the input electrical-current signal to produce, at an output of the transimpedance amplifier, an output voltage signal corresponding to the input electrical-current signal. The method further includes providing, by a current-control circuit coupled to the input and the output of the transimpedance amplifier, the DC cancellation current to the input of the transimpedance amplifier, where the DC cancellation current is based on the output voltage signal.

20 Claims, 7 Drawing Sheets

(51) Int. Cl.
*H04B 10/69* (2013.01)
*H04B 10/11* (2013.01)
*H04B 10/50* (2013.01)

(52) U.S. Cl.
CPC ............. *H04B 10/11* (2013.01); *H04B 10/50* (2013.01); *H04B 10/69* (2013.01)

(56) References Cited

U.S. PATENT DOCUMENTS

| | | | | |
|---|---|---|---|---|
| 2005/0061954 | A1* | 3/2005 | Itoh | H03F 3/08 |
| | | | | 250/214 A |
| 2009/0127461 | A1* | 5/2009 | Holcombe | H04B 10/1141 |
| | | | | 250/338.1 |
| 2010/0008662 | A1* | 1/2010 | Bradbeer | H04B 10/07955 |
| | | | | 398/25 |
| 2014/0111280 | A1* | 4/2014 | Schuppener | H03F 3/08 |
| | | | | 330/291 |
| 2017/0339695 | A1* | 11/2017 | Wang | H04W 72/0453 |
| 2018/0131342 | A1* | 5/2018 | Zamprogno | H03G 3/30 |

OTHER PUBLICATIONS

Maxim Low-Power Transimpedance Amplifier, Maxim Integrated Products, Maxim MAX3271 data sheet, 8 pages, Jul. 2006.

Ozbas, et al., High-Gain Differential Transimpedance Amplifier with DC Photodiode Current Rejection, Master's thesis, Worcester Polytechnic Institute, 100 pages, May 2005.

Phang, et al., A CMOS Optical Preamplifier for Wireless Infrared Communications, IEEE Transactions on Circuits and Systems—II: Analog and Digital Signal Processing, vol. 46(7):1-8, Jul. 1999.

\* cited by examiner

TRANSIMPEDANCE AMPLIFIER WITH AUTOMATIC CURRENT CONTROL

PRIORITY

This application claims the benefit, under 35 U.S.C. § 119(e), of U.S. Provisional Patent Application Ser. No. 62/439,837, filed Dec. 28, 2016, the entirety of which is incorporated herein by reference.

TECHNICAL FIELD

This disclosure generally relates to free-space optical communication.

BACKGROUND

A communication system may include a point-to-point optical-communication link where a transmitter and a receiver send or receive data using free-space optical communication. A point-to-point link may be a one-way link where one communication station transmits information to another communication station, or a point-to-point link may be bidirectional where both communication stations transmit and receive information. An optical-communication link may have a data rate between 1 megabit per second and 100 gigabits per second. For example, a free-space optical-communication link may have a data rate of 10 gigabits per second. In a free-space optical-communication link, a transmitter and receiver may be separated by relatively short distances (e.g., 1 m to 1 km) or moderate to long distances (e.g., 1 km to 100 km), and the transmitter and receiver may communicate using any suitable optical wavelength, such as for example, 780 nm, 1.3 µm, or 1.5 µm.

An unmanned aerial vehicle (UAV) may provide wireless connectivity to devices located on the ground. For example, a UAV may have an onboard communications module that wirelessly connects to the Internet (e.g., through a bidirectional link with a ground station), and a mobile computing device—such as a smartphone, tablet computer, or laptop computer—may wirelessly connect to the Internet through the UAV's communications module. A UAV may remain aloft for weeks, months, or years, and the UAV may provide access to the Internet and various data services (e.g., messaging, email, voice communication, social networking, search functions, health information, or weather information) to users located in a terrestrial area below the UAV.

SUMMARY OF PARTICULAR EMBODIMENTS

In particular embodiments, an optical receiver may be used for signal acquisition and signal tracking in a free-space optical-communication link. In particular embodiments, a free-space optical-communication link may include an optical transmitter that sends an optical beam to an optical receiver located some distance (e.g., 1-100 km) away. The optical beam may include an optical-communication signal (e.g., data with a 1-100 gigabit-per-second data rate) and an optical-beacon signal (e.g., a relatively low-frequency modulation, such as for example, a modulation with a frequency of 10-200 kHz). The optical-beacon signal may be used for signal acquisition to initially aim the optical beam onto the optical receiver and for signal tracking to maintain incidence of the optical beam on the optical receiver. During signal acquisition, the optical-beacon signal may have a relatively high modulation depth (e.g., 90-100%) and a relatively low DC offset (e.g., 0-10%), and the overall optical power received by the optical receiver may be relatively low. During signal tracking, the optical-beacon signal may have a relatively low modulation depth (e.g., 10%) and a relatively high DC offset (e.g., 90%), and the overall optical power received by the optical receiver may be relatively high.

For signal acquisition and signal tracking, an optical receiver may produce an electrical output signal that is used to provide feedback information so the aiming of the transmitter can be adjusted to establish and maintain the link between the transmitter and receiver. In particular embodiments, the optical receiver may include a transimpedance amplifier with a DC current-controller circuit. The DC current-controller circuit may provide automatic current control resulting in a different level of DC-current cancellation according to the amount of DC input current flowing into the transimpedance amplifier. A transimpedance amplifier with automatic current control may be able to receive and amplify signals that are fairly weak (without adding excessive electrical noise) as well as signals that are relatively strong and have a significant DC offset (without suffering from saturation problems). When the DC input current is relatively low (e.g., when the optical receiver is performing signal acquisition of a relatively weak optical signal), the transimpedance amplifier may provide low-noise amplification with little or no DC cancellation current provided by the DC current controller. When the DC input current is relatively high (e.g., when the optical receiver is performing signal tracking of a relatively strong optical signal), the DC current controller may provide a DC cancellation current that diverts most of the DC-offset current away from the transimpedance-amplifier input. This allows the transimpedance amplifier to provide amplification for the AC-portion of the input signal without becoming saturated by the relatively high DC input current.

The embodiments disclosed above are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

DESCRIPTION OF EXAMPLE EMBODIMENTS

Figure 1:
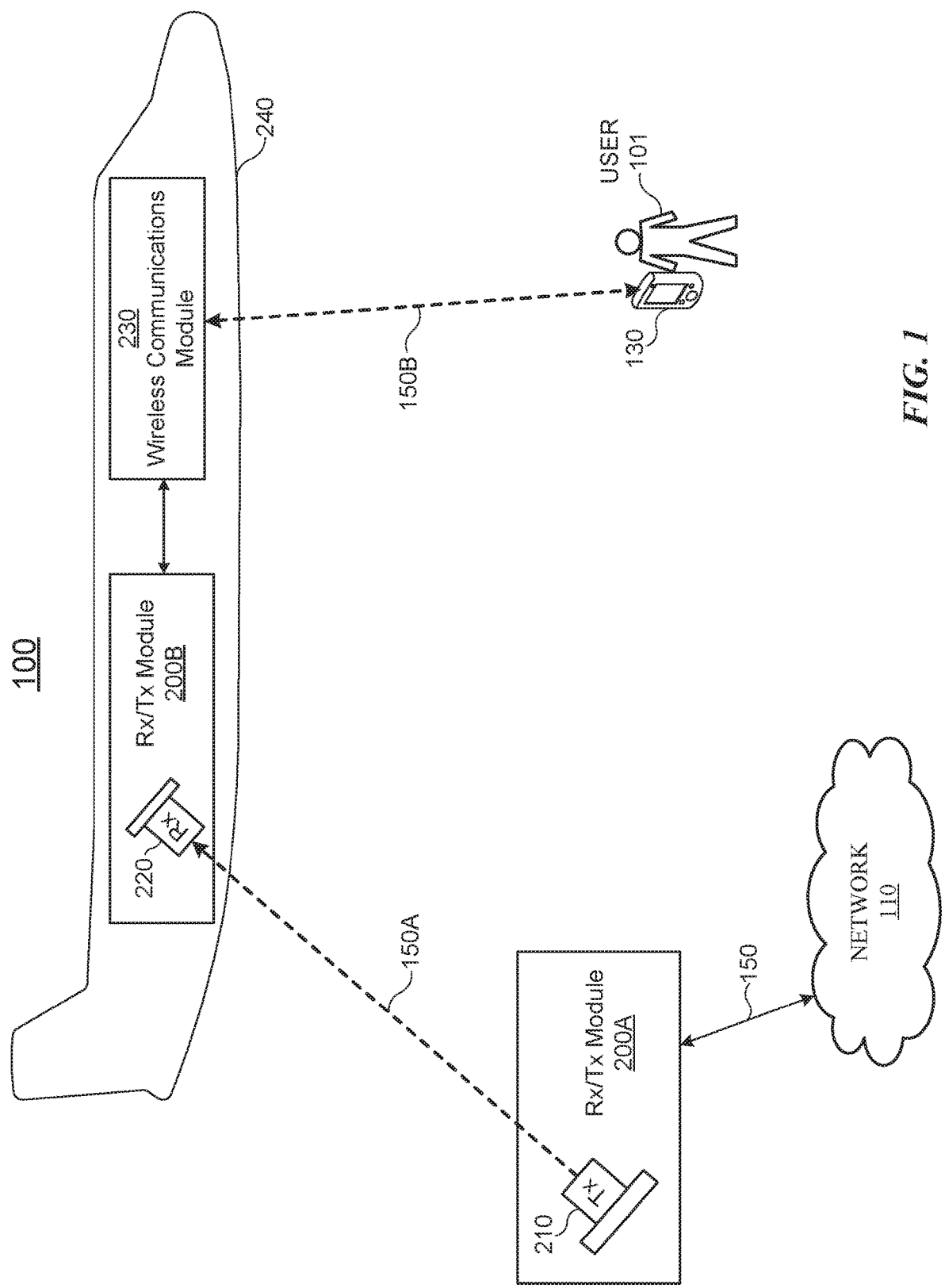
FIG. 1 illustrates an example network environment with a pair of Rx/Tx modules connected by a free-space optical link.

FIG. 1 illustrates an example network environment 100 with a pair of Rx/Tx modules (200A and 200B) connected by a free-space optical link 150A. In particular embodiments, an Rx/Tx module 200 may be located on the ground (e.g., in a ground-based communication station) or may be airborne. In the example of FIG. 1, Rx/Tx module 200A is ground based, and Rx/Tx module 200B is airborne. In particular embodiments, an Rx/Tx module 200 may be referred to as a receive/transmit module 200, a receiver/transmitter module 200, or a transceiver module 200. As illustrated in FIG. 1, Rx/Tx module 200A includes optical transmitter 210, and Rx/Tx module 200B includes optical receiver 220. Link 150A may be a one-way optical link where transmitter 210 of Rx/Tx module 200A transmits data in the form of a modulated optical signal to receiver 220 of Rx/Tx module 200B. In particular embodiments, Rx/Tx module 200A may also include an optical receiver 220 (not illustrated in FIG. 1), and Rx/Tx module 200B may also include an optical transmitter 210 (not illustrated in FIG. 1). As an example and not by way of limitation, link 150A may be a bidirectional link where Rx/Tx modules 200A and 200B each include an optical transmitter 210 and an optical receiver 220. Modules 200A and 200B may each be configured to send and receive information using their respective transmitter 210 and receiver 220.

In particular embodiments, a network environment 100 may include an unmanned aerial vehicle (UAV) 240 that provides wireless connectivity, through one or more links 150, to a network 110. As an example and not by way of limitation, one or more links 150 may connect client system 130 to UAV 240, and one or more other links 150 may connect UAV 240 to network 110. In the example of FIG. 1, client system 130 is connected to wireless communications module 230 by wireless link 150B, which may be a cellular or radio-frequency (RF) link. Ground-based Rx/Tx module 200A is connected to Rx/Tx module 200B of unmanned aerial vehicle (UAV) 240 by free-space optical link 150A, which may be a bidirectional link with a data rate of 1 to 100 gigabits per second (Gbps). Additionally, Rx/Tx module 200A is connected to network 110 by link 150, which may be a wireline, wireless, or optical (e.g., fiber-optic or free-space) link 150. Although FIG. 1 illustrates a particular arrangement of client system 130, links 150, Rx/Tx modules 200, and network 110, this disclosure contemplates any suitable arrangement of client system 130, links 150, Rx/Tx modules 200, and network 110. Moreover, although FIG. 1 illustrates a particular number of client systems 130, links 150, Rx/Tx modules 200, and networks 110, this disclosure contemplates any suitable number of client systems 130, links 150, Rx/Tx modules 200, and networks 110. As an example and not by way of limitation, network environment 100 may include multiple client systems 130, links 150, Rx/Tx modules 200, and networks 110.

This disclosure contemplates any suitable network 110. As an example and not by way of limitation, one or more portions of network 110 may include an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, or a combination of two or more of these. Network 110 may include one or more networks 110.

This disclosure contemplates any suitable links 150. In particular embodiments, one or more links 150 include one or more wireline (such as for example Digital Subscriber Line (DSL) or Data Over Cable Service Interface Specification (DOCSIS)), wireless (such as for example RF, Wi-Fi, or Worldwide Interoperability for Microwave Access (WiMAX)), or optical (such as for example free-space optical, Gigabit Ethernet (e.g., 10 Gigabit Ethernet) over optical fiber, Synchronous Optical Network (SONET), or Synchronous Digital Hierarchy (SDH)) links. In particular embodiments, one or more links 150 each include an ad hoc network, an intranet, an extranet, a VPN, a LAN, a WLAN, a WAN, a WWAN, a MAN, a portion of the Internet, a portion of the PSTN, a cellular technology-based network, a satellite communications technology-based network, another link 150, or a combination of two or more such links 150. Links 150 need not necessarily be the same throughout network environment 100. One or more first links 150 may differ in one or more respects from one or more second links 150.

In particular embodiments, a wireless link 150 may refer to any suitable electromagnetic-radiation-based communication signal transmitted through free space. As an example and not by way of limitation, a wireless link 150 may be a free-space optical link (e.g., link 150A in FIG. 1) that uses light for sending or receiving data. A free-space optical (FSO) link 150 may use light having any suitable wavelength, such as for example, near-ultraviolet light (e.g., light with a wavelength between approximately 100 nm and 400 nm), visible light (e.g., light with a wavelength between approximately 400 nm and 750 nm), or near-infrared light (e.g., light with a wavelength between approximately 750 nm and 2.5 µm). As another example and not by way of limitation, a wireless link 150 may use radio-frequency (RF) signals for communication (e.g., link 150B in FIG. 1). A wireless RF link 150 may operate at any suitable frequency from approximately 300 kHz to approximately 300 GHz. Although this disclosure describes and illustrates particular wireless links having particular wavelengths or frequencies, this disclosure contemplates any suitable wireless links having any suitable wavelengths or frequencies.

In particular embodiments, two Rx/Tx modules 200 may be directly connected to one another by a point-to-point wireless communications link 150 (which may be referred to as a point-to-point link 150, a wireless link 150, a FSO link, a communications link 150, a FSO communications link 150, or a link 150). In particular embodiments, a point-to-point link 150 may refer to a communications link 150 that directly and exclusively connects two Rx/Tx modules 200 to one another. In particular embodiments, a point-to-point communications link 150 may be a one-way link 150 (e.g., information or signals are sent in one direction from a transmitter 210 to a receiver 220) or a bidirectional link 150 (e.g., data is sent in both directions between two Rx/Tx modules 200). As an example and not by way of limitation, a bidirectional wireless link 150 between two Rx/Tx modules 200 may provide a data rate of 1-100 Gbps in each direction.

In particular embodiments, a user 101 may access the Internet on a client system 130 through one or more links 150 provided by UAV 240. As an example and not by way of limitation, client system 130 may connect to UAV 240 via a wireless link 150B (e.g., a cellular or RF link), and then, through UAV 240, client system 130 may connect to the Internet via one or more other links 150 (e.g., via FSO link 150A to a ground-based Rx/Tx module 200A, which is in turn connected to the Internet). In particular embodiments, user 101 may be an individual (human user), an entity (e.g., an enterprise, business, or third-party application), or a group (e.g., of individuals or entities) that interacts or communicates, at least in part, by a link 150 provided by UAV 240. Client system 130 may be any suitable computing device, such as, for example, a personal computer, a laptop computer, a cellular telephone, a smartphone, a tablet computer, or an augmented/virtual reality device. This disclosure contemplates any suitable client systems 130. A client system 130 may enable a network user at client system 130 to access network 110. A client system 130 may enable its user 101 to communicate with other users at other client systems 130. Although this disclosure describes and illustrates particular client systems accessing particular networks via particular links, this disclosure contemplates any suitable client systems accessing any suitable networks via any suitable links.

In particular embodiments, UAV 240 may be referred to as a drone, a remotely piloted aircraft, or an autonomous aircraft. In particular embodiments, UAV 240 may be a solar-powered aircraft configured to obtain at least some of its operating power from the sun and to remain aloft for weeks, months, or years. In particular embodiments, UAV 240 may be configured to fly at a cruising altitude within a range of approximately 3,000 feet to approximately 100,000 feet above sea level. As an example and not by way of limitation, UAV 240 may be configured to fly at an altitude within a range of approximately 60,000 to 70,000 feet above sea level. In particular embodiments, UAV 240 may be configured to fly along a particular flight path having a particular size, location, or shape (e.g., circular, figure eight, or elliptical).

As an example and not by way of limitation, UAV 240 may be configured to fly along a substantially circular flight path having a diameter of approximately 0.5 miles, 1 mile, 2 miles, 5 miles, or any suitable diameter. As another example and not by way of limitation, UAV 240 may be configured to fly along a flight path that is located directly, partially, or substantially above a location of a ground-based Rx/Tx module 200A. Additionally, UAV 240 may include wireless communications module 230, which may provide wireless connectivity to the Internet for one or more client systems 130 located within range of wireless communications module 230. Although this disclosure describes and illustrates particular UAVs configured to fly at particular altitudes and along particular flight paths, this disclosure contemplates any suitable UAVs configured to fly at any suitable altitudes and along any suitable flight paths.

Figure 2:
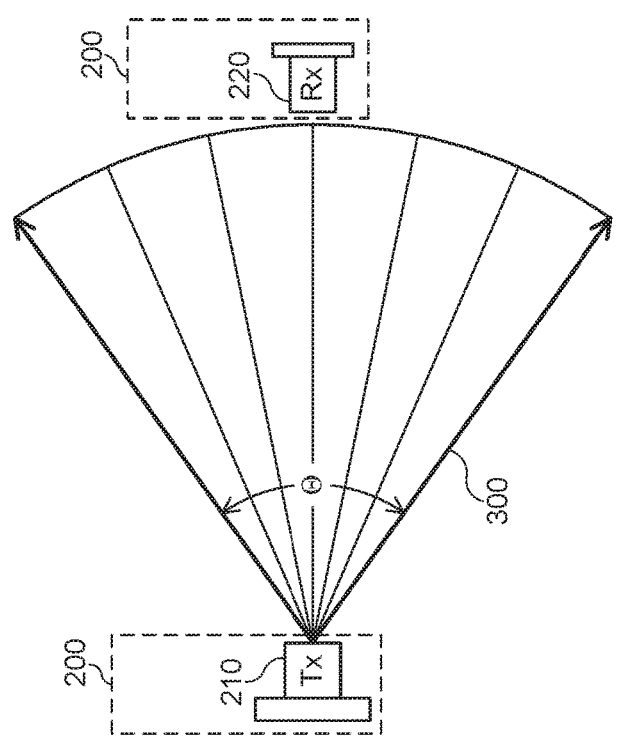
FIG. 2 illustrates an example optical beam that may be employed during signal acquisition.

FIG. 2 illustrates an example optical beam 300 that may be employed during signal acquisition. In particular embodiments, a signal-acquisition process may be used when an optical transmitter 210 is initially establishing a FSO link 150 with an optical receiver 220 (or is re-establishing a link 150 that was interrupted). In particular embodiments, during signal acquisition, optical transmitter 210 may transmit an optical beam 300 with a relatively wide angular distribution. As an example and not by way of limitation, during signal acquisition, optical beam 300 (e.g., beam 300 in FIG. 2) may have a divergence angle $\Theta$ of approximately 0.05 radians to approximately 1 radian (or, approximately 2.9° to 57°). In particular embodiments, optical beam 300 may have a substantially circular or elliptical cross section. As an example and not by way of limitation, optical beam may have a conical shape with a circular cross section. In particular embodiments, a wide optical beam 300 employed during signal acquisition may allow at least a portion of the optical beam 300 to be incident on optical receiver 220. Once the receiver 220 has detected optical beam 300, the optical-beam angle $\Theta$ can be narrowed to increase the intensity of optical beam 300, and the aiming of optical beam 300 can be adjusted to maintain incidence on receiver 220.

Figure 3:
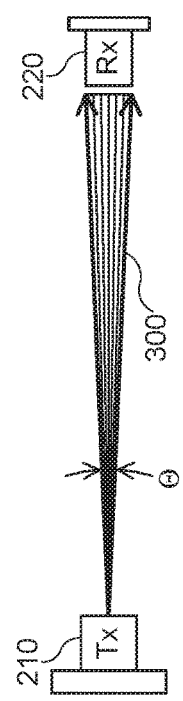
FIG. 3 illustrates an example optical beam that may be employed during signal tracking.

FIG. 3 illustrates an example optical beam 300 that may be employed during signal tracking. In particular embodiments, once a link 150 has been established between a transmitter 210 and a receiver 220, a signal-tracking process may be used to maintain the link 150 and keep optical beam 300 locked-on to receiver 220. In particular embodiments, during signal tracking, optical transmitter 210 may transmit an optical beam 300 with a relatively narrow angular distribution, and the pointing of optical beam 300 may be adjusted to maintain incidence on receiver 220. As an example and not by way of limitation, during signal tracking, optical beam 300 (e.g., beam 300 in FIG. 3) may have a divergence angle $\Theta$ of approximately 0.5 to 10 milliradians (or, approximately 0.0290 to 0.57°). Although this disclosure describes and illustrates particular optical beams having particular divergence angles, this disclosure contemplates any suitable optical beams having any suitable divergence angles.

In particular embodiments, transmitter 210 may include various components, such as for example, a laser source, a lens, an aiming mechanism, or a mirror. As an example and not by way of limitation, a laser source in transmitter 210 may be a directly modulated diode laser, such as for example, an aluminum-gallium-arsenide (AlGaAs) diode laser operating at a wavelength in the range of 780-790 nm or an indium-gallium-arsenide-phosphide (InGaAsP) diode laser operating at a wavelength in the range of 1.3-1.6 μm. As another example and not by way of limitation, transmitter 210 may include a continuous-wave (CW) diode laser with an external amplitude modulator (e.g., a lithium-niobate amplitude modulator). In particular embodiments, transmitter 210 may include a lens for focusing or adjusting the optical beam 300 emitted by a laser source. As an example and not by way of limitation, a lens may be positioned toward or away from the laser-source output to adjust the divergence angle $\Theta$, focusing, or size of the optical beam 300. In particular embodiments, transmitter 210 may include a mechanism for adjusting the pointing or aiming of the optical beam 300. As an example and not by way of limitation, a mechanical tip-tilt assembly may be used to adjust the orientation of the transmitter 210 causing the pointing of the laser to change. As another example and not by way of limitation, the optical beam 300 may be configured to reflect off a mirror, and the orientation of the mirror may be adjusted to change the pointing of the optical beam 300. When performing a signal-acquisition process, Rx/Tx module 200 may scan the pointing of optical beam 300 until a portion of the beam 300 is incident on receiver 220. Additionally, when performing a signal-tracking process, Rx/Tx module 200 may adjust the pointing of optical beam 300 to maintain incidence on receiver 220. Although this disclosure describes and illustrates particular laser transmitters that include particular components, this disclosure contemplates any suitable laser transmitters that include any suitable components.

In particular embodiments, transmitter 210 in FIGS. 2 and 3 may be part of an Rx/Tx module 200 that includes transmitter 210 along with a receiver 220 (not shown in FIGS. 2 and 3). Similarly, receiver 220 in FIGS. 2 and 3 may be part of an Rx/Tx module 200 that includes receiver 220 along with a transmitter 210 (not shown in FIGS. 2 and 3). As an example and not by way of limitation, transmitter 210 and receiver 220 in FIGS. 2 and 3 may be used to form a one-way FSO link 150 or may form part of a bidirectional FSO link 150. In particular embodiments, an Rx/Tx module 200 may be part of a ground-based communication station or an airborne communication station, and two Rx/Tx modules 200 connected by a FSO link 150 may be separated by a distance of approximately 1 km to 100 km. As an example and not by way of limitation, transmitter 210 and receiver 220 in FIGS. 2 and 3 may each be part of a ground-based Rx/Tx module 200. The ground-based Rx/Tx modules 200 may be located 40 km apart and may be connected by a bidirectional FSO link 150 having a data rate of approximately 32 Gbps in each direction. As another example and not by way of limitation, a ground-based Rx/Tx module 200 may be connected to an airborne Rx/Tx module 200 by a FSO link 150. In FIG. 1, a ground-based Rx/Tx module 200A is connected to an airborne Rx/Tx module 200B by a FSO link 150A. FSO link 150A may have a data rate of 10 Gbps, and Rx/Tx modules 200A and 200B may be separated by a distance of approximately 20-30 km. Although this disclosure describes and illustrates particular communication links having particular data rates and particular separation distances, this disclosure contemplates any suitable communication links having any suitable data rates and any suitable separation distances.

Figure 4:
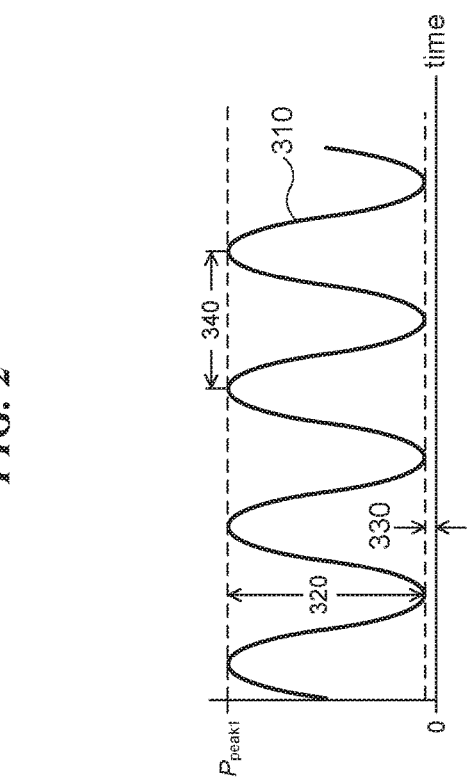
FIG. 4 illustrates an example optical-beacon signal that may be employed during signal acquisition.

FIG. 4 illustrates an example optical-beacon signal 310 that may be employed during signal acquisition. In the example of FIG. 4, optical-beacon signal 310 represents the time-dependent power or intensity of optical beam 300 illustrated in FIG. 2. As an example and not by way of limitation, optical-beacon signal 310 may represent an optical power (e.g., in watts) or an optical intensity (e.g., in watts/cm$^2$) of a portion of optical beam 300 received by optical receiver 220. The optical-beacon signal 310 has a time-varying portion 320 and a constant portion 330. In particular embodiments, time-varying portion 320 may be referred to as a modulated portion 320 or an alternating-current (AC) portion 320. In particular embodiments, time-varying portion 320 may have a modulation frequency of approximately 10 to 200 kHz, corresponding to a modulation period 340 of approximately 5 µs to 100 µs. In particular embodiments, time-varying portion 320 may have a sinusoidal shape (as illustrated in FIG. 4), a square-wave shape, a sawtooth shape, or any other suitable waveform shape. In particular embodiments, constant portion 330 may be referred to as a substantially constant portion 330, a direct-current (DC) portion 330, a DC-offset portion 330, a DC offset 330, or an offset portion 330. In particular embodiments, constant portion 330 may correspond to a portion of optical signal 310 that varies by less than a particular amount over a particular time interval. As an example and not by way of limitation, constant portion 330 may vary by less than 1% of a peak amplitude $P_{peak1}$ of optical signal 310 over a 1-second time period.

In the example of FIG. 4, the DC-offset portion 330 of optical-beacon signal 310 may be within a range of 0% to approximately 20% of the peak amplitude $P_{peak1}$ of signal 310. As an example and not by way of limitation, DC-offset portion 330 may make up 10% of optical-beacon signal 310 (e.g., DC-offset portion 330 may be 10% of $P_{peak1}$), and AC portion 320 may make up the remaining 90% of optical-beacon signal 310. As another example and not by way of limitation, DC-offset portion 330 may make up less than or equal to 2% of optical-beacon signal, and AC portion 320 may make up greater than or equal to 98% of optical-beacon signal 310. As another example and not by way of limitation, DC-offset portion 330 may make up 0% of optical-beacon signal 310 so that AC portion 320 makes up 100% of optical-beacon signal 310 (e.g., optical-beacon signal 310 is 100% modulated and has no DC-offset portion 330). In particular embodiments, the magnitude of AC portion 320 relative to $P_{peak1}$ may be referred to as the modulation depth of optical-beacon signal 310. As an example and not by way of limitation, if optical-beacon signal 310 has no DC-offset portion, then optical-beacon signal 310 may be referred to as having a 100% depth of modulation.

Figure 5:
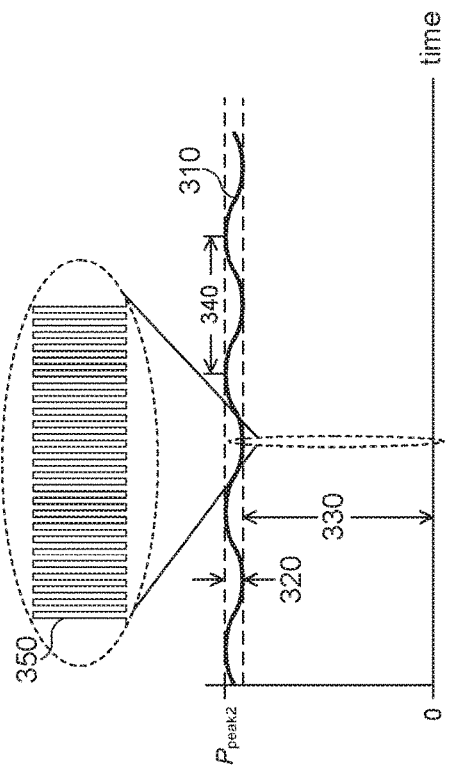
FIG. 5 illustrates an example optical-beacon signal that may be employed during signal tracking.

FIG. 5 illustrates an example optical-beacon signal 310 that may be employed during signal tracking. In the example of FIG. 5, optical-beacon signal 310 represents the time-dependent power or intensity of optical beam 300 illustrated in FIG. 3. For a signal-tracking process, the DC-offset portion 330 of optical-beacon signal 310 in FIG. 5 may be within a range of 80% to approximately 100% of the peak amplitude $P_{peak2}$ of signal 310. As an example and not by way of limitation, DC-offset portion 330 may make up greater than or equal to 90% of optical-beacon signal 310 (e.g., DC-offset portion 330 may be greater than or equal to 90% of $P_{peak2}$), and AC portion 320 may make up less than or equal to 10% of optical-beacon signal 310. As another example and not by way of limitation, DC-offset portion 330 may be approximately 95% of $P_{peak2}$ and, and AC portion 320 may be approximately 5% of $P_{peak2}$. Although this disclosure describes and illustrates particular optical-beacon signals having particular constant portions and having particular time-varying portions with particular modulation frequencies, this disclosure contemplates any suitable optical-beacon signals having any suitable constant portions and having any suitable time-varying portions with any suitable modulation frequencies.

In particular embodiments, the peak power or intensity $P_{peak1}$ of optical signal 310 in FIG. 4 may be several orders of magnitude smaller than the peak power or intensity $P_{peak2}$ of optical signal 310 in FIG. 5. As an example and not by way of limitation, when operating in a signal-acquisition mode, optical beam 300 in FIG. 2 may have a peak intensity at receiver 220 of approximately 0.1 to 50 nW/cm$^2$. When operating in a signal-tracking mode, optical beam 300 in FIG. 3 may have a peak intensity at receiver 220 of approximately 1 to 500 µW/cm$^2$. Although this disclosure describes and illustrates particular optical beams having particular intensity values, this disclosure contemplates any suitable optical beams having any suitable intensity values.

In particular embodiments, an optical-beacon signal 310 may include high-frequency data 350. As an example and not by way of limitation, high-frequency data 350 may be a high-frequency amplitude modulation imposed on optical beam 330. In the example of FIG. 5, the expanded inset illustrates high-frequency data 350, which may represent a portion of data transmitted by optical signal 310. In particular embodiments, an optical beam 330 may include a high-frequency data modulation 350 as well as an envelope modulation corresponding to time-varying portion 320 of optical-beacon signal 310. In particular embodiments, high-frequency data 350 may represent data sent by transmitter 210 to receiver 220, and high-frequency data 350 may have a data rate of 1 to 100 Gbps. The bit rate of the high-frequency data 350 may be several orders of magnitude higher than the relatively low frequency of the time-varying portion 320 of optical-beacon signal 310. As an example and not by way of limitation, high-frequency data 350 may have a bit rate of 10 Gbps (corresponding to a bit period of 0.1 ns), and time-varying portion 320 of optical-beacon signal 310 may have a frequency of 70-95 kHz (corresponding to a period 340 of 10.5-14.3 µs). Although this disclosure describes and illustrates particular data signals having particular bit rates, this disclosure contemplates any suitable data signals having any suitable bit rates.

In particular embodiments, optical receiver 220 may include a high-speed optical receiver and a low-speed optical receiver. The high-speed receiver may be used to extract the high-frequency data portion 350 from optical signal 310, and the low-speed receiver may be used for signal acquisition and signal tracking. As an example and not by way of limitation, a high-speed optical receiver may be configured to receive optical signal 310 and produce an electrical-output signal based on the high-frequency data portion 350. The high-frequency data 350 may have a modulation frequency above approximately 100 MHz or a data rate above approximately 100 megabits per second. As another example and not by way of limitation, a low-speed receiver may be configured to receive optical signal 310 and produce an electrical-output signal based on the time-varying portion 320 and the constant portion 330 of optical signal 310. The low-speed receiver may have a frequency response that cuts off above a particular frequency (e.g., a frequency between 0.5 and 2 MHz), and so the low-speed receiver may not be sensitive to the high-frequency data portion 350 of the optical signal 310.

Figure 6:
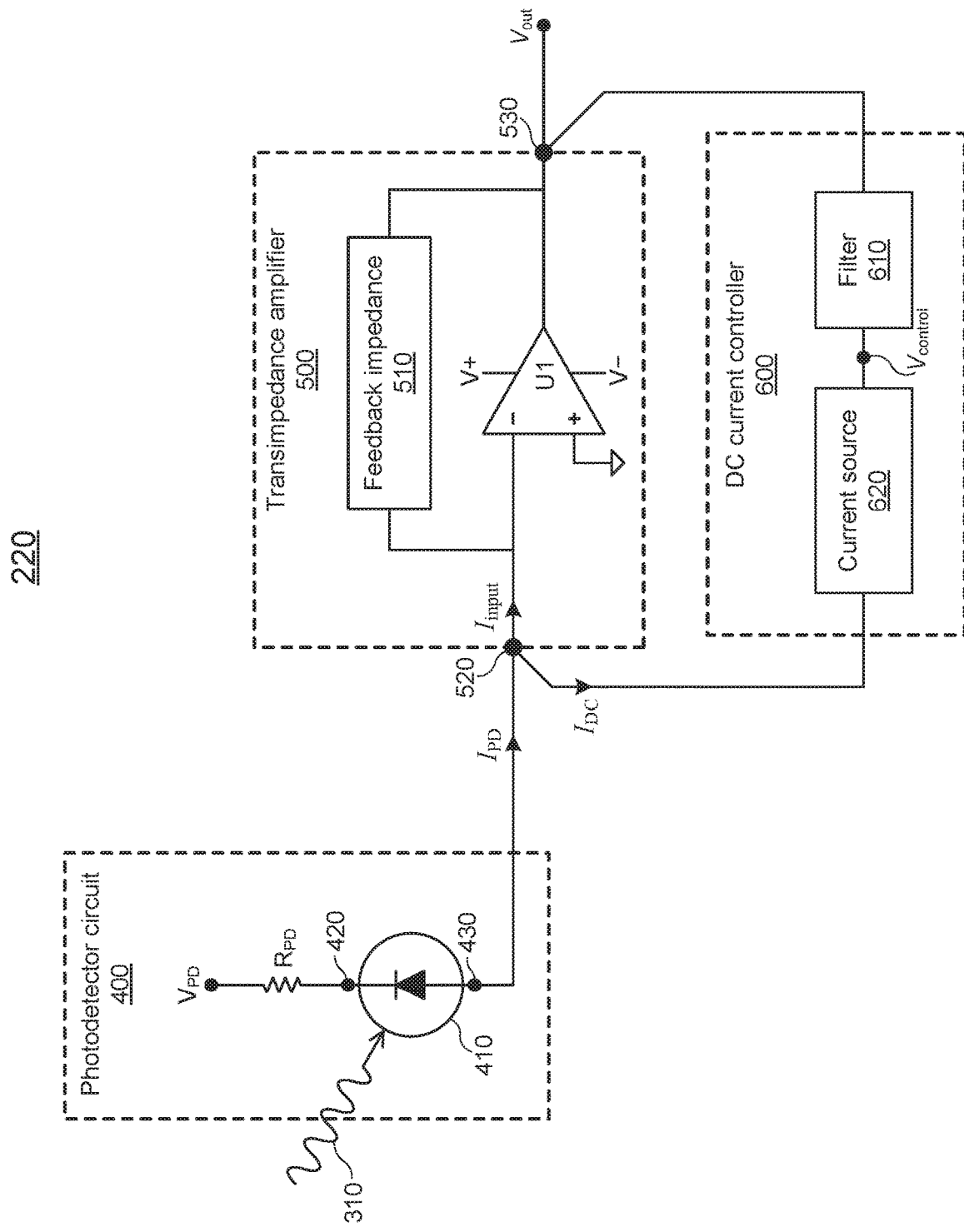
FIG. 6 illustrates an example optical receiver.

FIG. 6 illustrates an example optical receiver 220. In the example of FIG. 6 (and FIG. 7 described below), optical receiver 220 may correspond to a low-speed optical receiver 220 for use in signal acquisition and signal tracking. Optical receiver 220 illustrated in FIG. 6 may be configured to receive optical signal 310 (e.g., optical signal 310 as illustrated in FIG. 4 or FIG. 5) and produce an electrical-output signal $V_{out}$ based on time-varying portion 320 and constant portion 330 of optical signal 310. In particular embodiments, the output voltage signal $V_{out}$ may be used for signal acquisition and signal tracking. As an example and not by way of limitation, output signal $V_{out}$ may be analyzed to provide feedback information to an optical transmitter 210 so that the optical transmitter can adjust the aiming of optical beam 300 to maintain incidence on receiver 220. In particular embodiments, optical receiver 220 may include a photodetector circuit 400, a transimpedance amplifier 500, and a DC current controller 600. Although this disclosure describes and illustrates particular optical receivers that include particular components, this disclosure contemplates any suitable optical receivers that include any suitable components.

In particular embodiments, photodetector circuit 400 may be configured to receive input optical signal 310 (which includes time-varying portion 320 and constant portion 330) and produce a photodetector current $I_{PD}$ corresponding to the received optical signal 310. In the example of FIG. 6, photodetector circuit 400 includes resistor $R_{PD}$ with one terminal coupled to the cathode 420 of photodetector 410 and the other terminal coupled to a bias voltage $V_{PD}$. In particular embodiments, resistor $R_{PD}$ may have any suitable resistance value, such as for example a resistance value from 50Ω to 20 kΩ. The anode 430 of photodetector 410 is coupled to input 520 of transimpedance amplifier 500. In particular embodiments, photodetector circuit 400 may include a lens (not shown in FIG. 6) to focus the light from optical beam 300 onto photodetector 410. When optical signal 310 is incident on photodetector 410, a photodetector current $I_{PD}$ corresponding to the received optical signal 310 is produced, and photodetector current $I_{PD}$ flows to input 520. In particular embodiments, photodetector current $I_{PD}$ may include an AC portion (e.g., $I_{PD-AC}$) corresponding to time-varying portion 320 of optical signal 310 and a DC portion (e.g., $I_{PD-DC}$) corresponding to constant portion 330 of optical signal 310. As an example and not by way of limitation, if the time-varying portion 320 of optical signal 310 received by photodetector 410 has a frequency of 76 kHz and a peak optical-power amplitude of 2 µW, then the corresponding AC portion of photodetector current $I_{PD-AC}$ produced by photodetector 410 may have a frequency of 76 kHz and a peak amplitude of 1.2 µA (which corresponds to photodetector 410 having an optical responsivity of 0.6 A/W). As another example and not by way of limitation, if the constant portion 330 of optical signal 310 received by photodetector 410 has an optical power of 10 µW, then the corresponding DC portion of photodetector current $I_{PD-DC}$ produced by photodetector 410 may have an amplitude of 6 µA. Although this disclosure describes and illustrates particular optical signals having particular optical power levels, this disclosure contemplates any suitable optical signals having any suitable optical power levels.

In particular embodiments, photodetector 410 may be a photodiode, such as for example, a semiconductor diode structure that converts received light into an electrical current.

As an example and not by way of limitation, photodetector 410 may be a silicon photodiode, germanium photodiode, or indium-gallium-arsenide photodiode. As another example and not by way of limitation, photodetector 410 may be a photodiode with an active area of approximately 1 to 100 mm². As another example and not by way of limitation, photodetector 410 may be a photodiode with an optical responsivity of 0.1 to 1 amperes per watt (A/W) of incident optical power. A photodiode with an optical responsivity of 0.8 A/W that receives 1 µW of optical power from an optical beam 300 may produce approximately 0.8 µA of electrical current in response to the received light.

In particular embodiments, bias voltage $V_{PD}$ may be approximately 0 volts so that photodetector 410 is unbiased, or bias voltage $V_{PD}$ may be greater than 0 volts. As an example and not by way of limitation, $V_{PD}$ may be 1-5 volts so that photodetector 410 is reverse biased. In particular embodiments, the orientation of photodetector 410 may be switched with respect to its orientation as illustrated in FIG. 6. As an example and not by way of limitation, anode 430 of photodetector 410 may be coupled to resistor $R_{PD}$, and cathode 420 may be coupled to input 520 of transimpedance amplifier 500. In this case, bias voltage $V_{PD}$ may be less than or equal to 0 volts (e.g., $V_{PD}$ may be between 0 and −5 volts). Although this disclosure describes and illustrates particular photodetector circuits that include particular photodetectors having particular orientations and particular bias voltages, this disclosure contemplates any suitable photodetector circuits that include any suitable photodetectors having any suitable orientations and any suitable bias voltages.

In particular embodiments, transimpedance amplifier 500 may be configured to receive at input 520 an input electrical-current signal $I_{input}$. As illustrated in FIG. 6, the input electrical-current signal $I_{input}$ includes photodetector current $I_{PD}$ (which includes an AC portion $I_{PD-AC}$ and a DC portion $I_{PD}$-D) from photodetector circuit 400 and DC cancellation current $I_{DC}$ supplied by DC current controller 600. In particular embodiments, the input electrical-current signal $I_{input}$ may equal a sum of the photodetector current $I_{PD}$ and the DC cancellation current $I_{DC}$ so that $I_{input}=I_{PD}+_{DC}=I_{PD-AC}+I_{PD-DC}+I_{DC}$. In particular embodiments, the DC cancellation current $I_{DC}$ may have a direction, with respect to transimpedance amplifier input 520, that is opposite the direction of the DC portion of the photodetector current $I_{PD-DC}$. As an example and not by way of limitation, the DC portion of photodetector current $I_{PD-DC}$ may be a positive current (e.g., directed into input 520), and the DC cancellation current $I_{DC}$ may be a negative current (e.g., directed away from input 520). As another example and not by way of limitation, the DC portion of photodetector current $I_{PD-DC}$ may be a negative current (e.g., directed away from input 520), and the DC cancellation current $I_{DC}$ may be a positive current (e.g., directed into input 520).

In particular embodiments, DC cancellation current $I_{DC}$ may be configured to divert (or subtract off) at least part of the DC portion of photodetector current $I_{PD-DC}$ away from input 520. As an example and not by way of limitation, the DC portion of photodetector current $I_{PD-DC}$ may have an amplitude of 10 nA directed into input 520, and $I_{DC}$ may have an amplitude of 6 nA directed away from input 520, resulting in a net DC input current to transimpedance amplifier 500 of 4 nA. As another example and not by way of limitation, the DC portion of photodetector current $I_{PD-DC}$ may have an amplitude of 10 µA directed away from input 520, and $I_{DC}$ may have an amplitude of 9.95 µA directed into input 520. This results in a net DC input current to transimpedance amplifier 500 of −0.05 µA. In particular embodiments, the amplitude of the DC cancellation current $I_{DC}$ may be approximately zero. As an example and not by way of limitation, the DC portion of photodetector current $I_{PD-DC}$ may have an amplitude of 100 µA directed into input 520, and $I_{DC}$ may have an amplitude of less than 1 µA, resulting in a net DC input current to transimpedance amplifier of 99-100 µA. As another example and not by way of limitation, the DC portion of photodetector current $I_{PD-DC}$ may have an amplitude of 50 µA directed into input 520, and $I_{DC}$ may have an amplitude of approximately 0 µA, resulting in a net DC input current to transimpedance amplifier of approximately 50 µA. Although this disclosure describes and illustrates particular electrical currents having particular amplitudes and particular directions, this disclosure contemplates any suitable electrical currents having any suitable amplitudes and any suitable directions.

In particular embodiments, transimpedance amplifier 500 may be configured to perform a transimpedance amplification of input electrical-current signal $I_{input}$ to produce, at output 530 of transimpedance amplifier 500, an output voltage signal $V_{out}$ corresponding to the input electrical-current signal $I_{input}$. In the example of FIG. 6, transimpedance amplifier 600 includes operational amplifier (or, op-amp) U1 with feedback impedance 510 coupled to the negative input (or, inverting input) and the output 530 of op-amp U1. The positive input (or, non-inverting input) of op-amp U1 is coupled to ground, and the V+ and V− terminals represent the positive and negative power-supply voltages, respectively. As an example and not by way of limitation, V+ and V− may correspond to power-supply voltages of +5 V and −5 V, respectively.

In particular embodiments, a transimpedance amplification may refer to an electrical amplification process where an input current (e.g., $I_{input}$) is converted into an output voltage (e.g., $V_{out}$). A transimpedance amplification may be characterized in part by a transimpedance gain (G) which has units of volts per ampere (V/A). As an example and not by way of limitation, output voltage signal $V_{out}$ may be related to input electrical-current signal $I_{input}$ by the expression $V_{out}=G\times I_{input}$. In particular embodiments, the transimpedance gain G may be positive or negative depending on whether transimpedance amplifier 500 is configured as a non-inverting or inverting amplifier, respectively. Similarly, the output voltage $V_{out}$ may be positive or negative depending on whether G is positive or negative and on the direction of input current $I_{input}$. As used herein, the transimpedance gain G may be expressed as a positive value with the understanding that the value of G may be positive or negative. Similarly, the output voltage $V_{out}$ may be expressed as a positive value with the understanding that the value of $V_{out}$ may be positive or negative. In particular embodiments, a resistance value of feedback impedance 510 may determine at least part of the transimpedance gain of transimpedance amplifier 500. In particular embodiments, feedback impedance 510 may include a resistor with a value from $10^5$ ohms to $10^7$ ohms, resulting in a corresponding transimpedance gain of $10^5$ V/A to $10^7$ V/A. As an example and not by way of limitation, feedback impedance 510 may include a $10^6$-ohm resistor, resulting in a $10^6$ V/A transimpedance gain for transimpedance amplifier 500. For a $10^6$ V/A transimpedance gain, a DC input current of 1 µA will result in a DC output voltage of approximately 1 volt, based on the above expression (e.g., $10^6$ V/A×1 µA=1 V).

In particular embodiments, DC current controller 600 may be configured to provide DC cancellation current $I_{DC}$ to transimpedance-amplifier input 520. In particular embodiments, DC current controller 600 may be referred to as a current-control circuit 600, a DC control circuit 600, or an automatic current-control circuit 600. As illustrated in FIG. 6, DC current controller 600 is coupled to input 520 and output 530 of transimpedance amplifier 500. In particular embodiments, the DC cancellation current $I_{DC}$ may be based on the output voltage signal $V_{out}$. The DC current controller 600 is configured to receive the output voltage signal $V_{out}$ produced by transimpedance amplifier 500 and provide the DC cancellation current $I_{DC}$ to the input 520 of the transimpedance amplifier 500, where the DC cancellation current $I_{DC}$ is based on the output voltage signal $V_{out}$.

In particular embodiments, output voltage signal $V_{out}$ may include an AC-voltage portion and a DC-voltage portion. The AC-voltage portion may correspond to the AC portion of the photodetector current $I_{PD-AC}$, and the DC-voltage portion may correspond to a sum of the DC portion of the photodetector current $I_{PD-DC}$ and the DC cancellation current $I_{DC}$. As an example and not by way of limitation, if the AC portion of the photodetector current is a sinusoid with a 92-kHz frequency and a peak-to-peak amplitude of 50 nA, then, for a transimpedance gain of $10^6$ V/A, the AC-voltage portion of the output voltage signal $V_{out}$ may be a sinusoidal voltage signal with a 92-kHz frequency and a peak-to-peak amplitude of 50 mV. As another example and not by way of limitation, if the DC portion of the photodetector current has a value of +10 µA (e.g., the DC portion is a current flowing into input 520) and the DC cancellation current $I_{DC}$ has a value of −9.99 µA (e.g., $I_{DC}$ is a current flowing away from input 520), then the sum of the two DC currents is +10 nA. For a transimpedance gain of $10^6$ V/A, the DC-voltage portion of the output voltage signal $V_{out}$ may have a magnitude of 10 nA×106 V/A=10 mV.

In particular embodiments, DC current controller 600 may be configured to produce DC cancellation current $I_{DC}$, where $I_{DC}$ is based on the DC-voltage portion of the output voltage signal $V_{out}$. As an example and not by way of limitation, DC current controller 600 may smooth, remove, average, or filter out the AC-voltage portion of the output voltage signal $V_{out}$, and DC current controller 600 may produce a DC cancellation current $I_{DC}$ based on the DC-voltage portion of the output voltage signal $V_{out}$. In particular embodiments, DC current controller 600 may include a filtering circuit 610 and a current-source circuit 620. In particular embodiments, filtering circuit 610 may be configured to receive the output voltage signal $V_{out}$ from output 530 of the transimpedance amplifier 500 and produce a control voltage $V_{control}$ based on the output voltage signal $V_{out}$. As an example and not by way of limitation, $V_{control}$ may be a DC voltage that is based on the DC-voltage portion of the output voltage signal $V_{out}$. Filtering circuit 610 may include a low-pass filter or an integrator that substantially smooths, removes, averages, or filters out the AC-voltage portion of output voltage signal $V_{out}$. In particular embodiments, current-source circuit 620 may be configured to receive control voltage $V_{control}$ from the filtering circuit 610 and produce the DC cancellation circuit $I_{DC}$ based on the received control voltage. As an example and not by way of limitation, if $V_{control}$ is zero, then $I_{DC}$ may be zero, and as $V_{control}$ increases in magnitude, then $I_{DC}$ may also increase.

Figure 7:
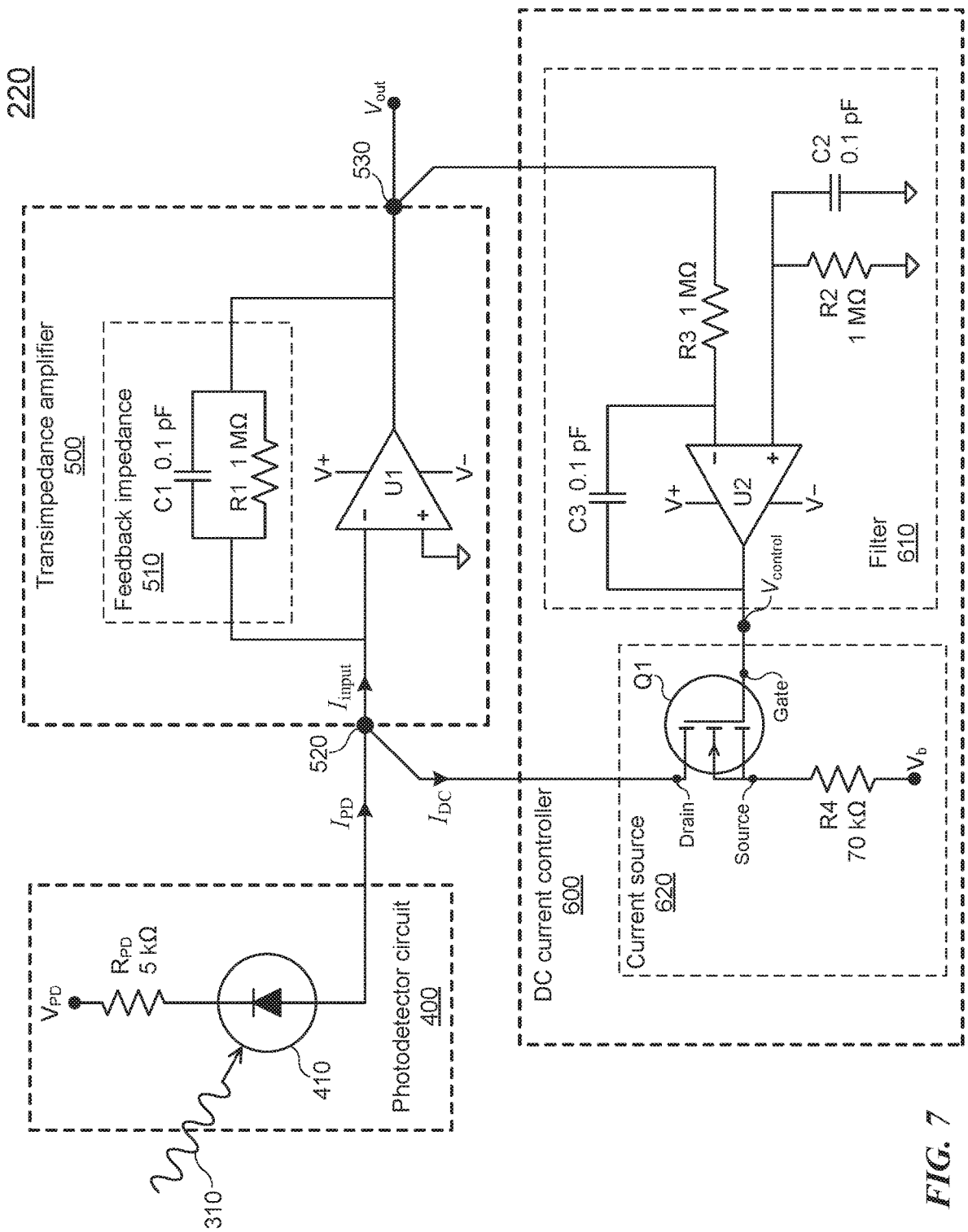
FIG. 7 illustrates another example optical receiver.

FIG. 7 illustrates another example optical receiver 220. In the example of FIG. 7, optical receiver 220 is configured to receive optical signal 310 (e.g., optical signal 310 illustrated in FIG. 4 or FIG. 5) and produce an electrical-output signal $V_{out}$ based on optical signal 310. Optical receiver 220 illustrated in FIG. 7 operates in a manner similar to optical receiver 220 illustrated in FIG. 6 and described above. Optical receiver 220 in FIG. 7 includes photodetector circuit 400, transimpedance amplifier 500, and DC current controller 600. Photodetector circuit 400 includes a 5-k resistor $R_{PD}$ coupled to photodetector 410. When optical signal 310 is incident on photodetector 410, a photodetector current $I_{PD}$ corresponding to the received optical signal 310 is produced and flows to transimpedance-amplifier input 520.

Transimpedance amplifier 500 illustrated in FIG. 7 includes op-amp U1 with feedback impedance 510. In particular embodiments, feedback impedance 510 may include a parallel combination of capacitor C1 and resistor R1 which functions as a low-pass filter with a cutoff frequency of approximately $f_c=1/(2\pi \cdot R1 \cdot C1)$. The gain of transimpedance amplifier 500 has a substantially flat frequency response from DC to approximately $f_c$, and above $f_c$, the gain of the transimpedance amplifier 500 decreases. In FIG. 7, feedback impedance 510 includes a 1-MΩ resistor R1 in parallel with a 0.1 pF capacitor C1. The value of resistor R1 determines the DC gain of transimpedance amplifier 500. In FIG. 7, the 1-MΩ resistor corresponds to a transimpedance gain of $10^6$ V/A. The value of capacitor C1 in combination with the value of resistor R1 determines the frequency response of the transimpedance gain. Based on the above expression for $f_c$, the cutoff frequency for transimpedance amplifier 500 in FIG. 7 is approximately 1.6 MHz. For this transimpedance amplifier 500, the DC portion of the photodetector current $I_{PD-DC}$ will be amplified by a transimpedance gain of approximately 106 A/W. Also, the AC portion $I_{PD-AC}$, which may have a modulation frequency below 200 kHz (which is well below the 1.6-MHz cutoff frequency), will also be amplified by a transimpedance gain of approximately $10^6$ A/W since the gain is substantially flat below the cutoff frequency. Although this disclosure describes and illustrates particular transimpedance amplifiers having particular feedback impedances, gains, and frequency responses, this disclosure contemplates any suitable transimpedance amplifiers having any suitable feedback impedances, gains, and frequency responses.

In particular embodiments, DC current controller 600 may be configured to provide DC cancellation current $I_{DC}$ to transimpedance-amplifier input 520 based on output voltage signal $V_{out}$. In FIG. 7, DC current controller 600 includes filtering circuit 610 and current-source circuit 620. Filtering circuit 610 receives and filters output voltage signal $V_{out}$ and provides a control voltage $V_{control}$ to current-source circuit 620 based on the filtered voltage signal $V_{out}$. In particular embodiments, filtering circuit 610 may include an op-amp configured to operate as a low-pass filter. As an example and not by way of limitation, output voltage signal $V_{out}$ may include an AC-voltage portion (e.g., corresponding to the AC portion of the photodetector current $I_{PD-AC}$) and a DC-voltage portion (e.g., corresponding to a sum of the DC portion of the photodetector current $I_{PD-DC}$ and the DC cancellation current $I_{DC}$). As an example and not by way of limitation, the AC-voltage portion may have a frequency of 80 kHz, and the low-pass filter may have a cutoff frequency of approximately 5 kHz. Filtering circuit 610 may include an op-amp configured as a low-pass filter that filters out most of the AC-voltage portion, and the output of filtering circuit 610 is a control voltage $V_{control}$ that is based substantially on the DC-voltage portion of $V_{out}$. In particular embodiments, filtering circuit 610 may include an op-amp configured to operate as an integrator. In the example of FIG. 7, filtering circuit 610 includes op-amp U2 configured to operate as an integrator with input resistor R3 and feedback capacitor C3. Additionally, resistor R2 and capacitor C2 are coupled to the non-inverting input of op-amp U2. Filtering circuit 610 in FIG. 7 acts as an integrator and integrates the voltage signal $V_{out}$ from transimpedance amplifier 500. Integrating voltage signal $V_{out}$ may effectively act as a low-pass filter that removes, reduces, or substantially averages out the AC-voltage portion from output voltage signal $V_{out}$. The output of filter 610 is a control voltage $V_{control}$ that is based substantially on the DC-voltage portion of $V_{out}$. The control voltage $V_{control}$ is provided to current source 620, and $V_{control}$ controls the amount of DC cancellation current $I_{DC}$ supplied by DC current controller 600. Although this disclosure describes and illustrates particular filtering circuits that include particular components, this disclosure contemplates any suitable filtering circuits that include any suitable components.

In the example of FIG. 7, DC current source 620 includes transistor Q1 and a 70-k resistor R4. A bias voltage of $V_b$ is applied to one terminal of resistor R4. In particular embodiments, resistor R4 may have any suitable resistance value, such as for example, a resistance of 10-200 kΩ. In particular embodiments, bias voltage $V_b$ may be any suitable voltage, such as for example any suitable voltage from +5 V to −5 V. As an example and not by way of limitation, bias voltage $V_b$ may be −1 volt. In particular embodiments, DC current source 620 may include any suitable transistor Q1 configured to supply DC cancellation current $I_{DC}$ based on the received control voltage $V_{control}$. In the example of FIG. 7, transistor Q1 is an n-channel enhancement-mode metal-oxide-semiconductor field-effect transistor (MOSFET). The gate terminal of transistor Q1 is configured to receive the control voltage $V_{control}$ from the filter circuit 610. The source terminal of transistor Q1 is coupled to resistor R4, and the drain of transistor Q1 is coupled to input 520 of transimpedance amplifier 500. The transistor Q1 produces DC cancellation current $I_{DC}$ based on the control voltage $V_{control}$ applied to the gate terminal of transistor Q1. As an example and not by way of limitation, as the magnitude of $V_{control}$ increases, the magnitude of $I_{DC}$ may also increase. Although this disclosure describes and illustrates particular current-source circuits that include particular components, this disclosure contemplates any suitable current-source circuits that include any suitable components.

Figure 8:
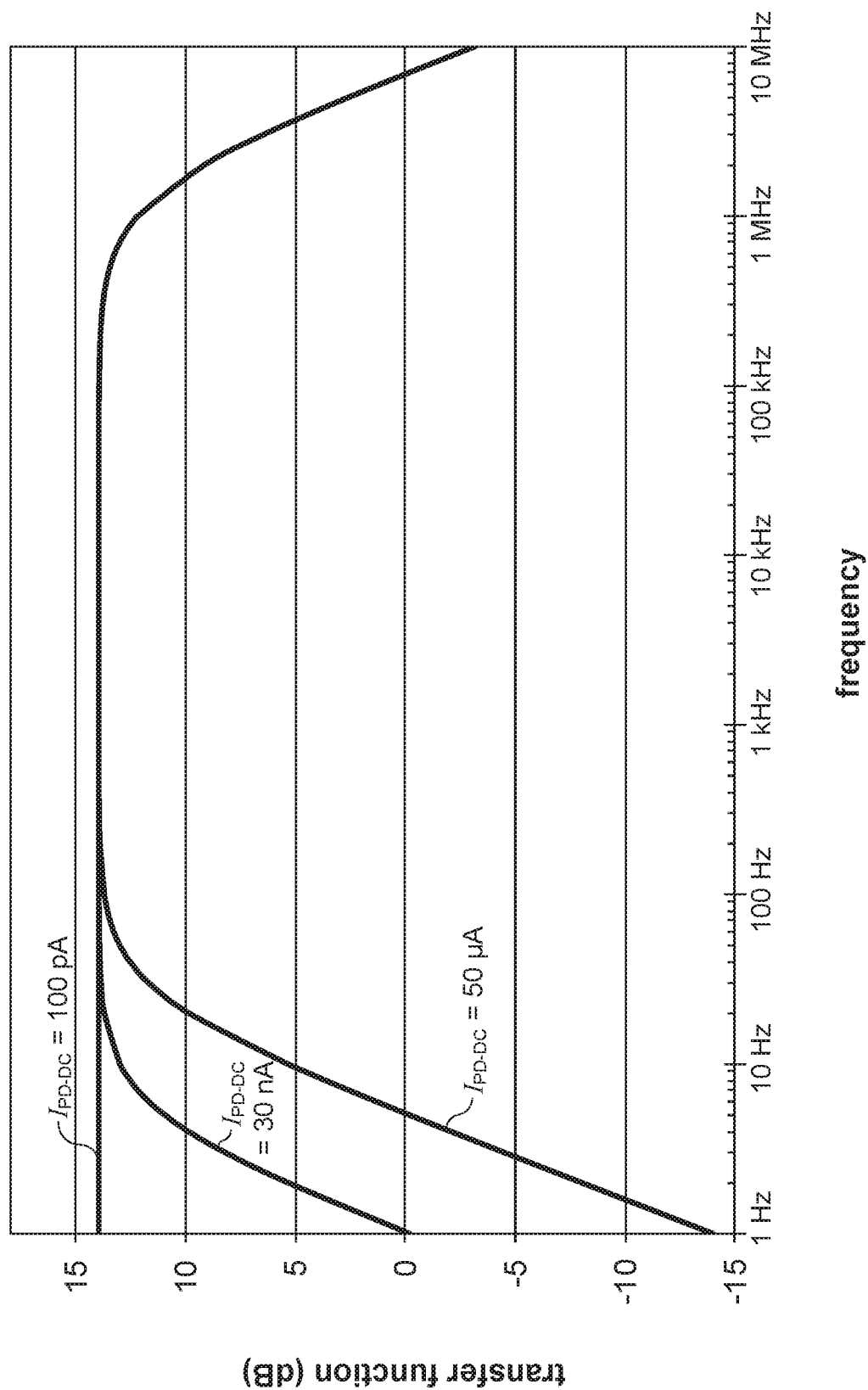
FIG. 8 illustrates three example transfer-function curves associated with an optical receiver.

FIG. 8 illustrates three example transfer-function curves associated with an optical receiver 220. As an example and not by way of limitation, the three transfer-function curves in FIG. 8 may each represent a transfer function associated with transimpedance amplifier 500 and DC current controller 600 in FIG. 6 or FIG. 7. The transfer-function curves illustrate the frequency behavior of the gain of transimpedance amplifier 500 with DC current controller 600. At higher frequencies (e.g., above approximately 100 Hz), the three curves merge together and exhibit approximately the same frequency characteristics. Above 100 Hz, the three transfer-function curves are flat with a value of approximately 14 dB until approximately 1 MHz when the curves begin to roll-off with a slope of approximately –20 dB/decade. This high-frequency roll-off behavior may be associated with a low-pass filtering provided by feedback impedance 510. At lower frequencies, below about 100 Hz, the three transfer-function curves diverge. The 100 pA transfer-function curve corresponds to the behavior of transimpedance amplifier 500 (with DC current controller 600) for an input DC portion of photodetector current $I_{PD\text{-}DC}$ of 100 pA. Similarly, the 30 nA transfer-function curve corresponds to the behavior when $I_{PD\text{-}DC}$ is 30 nA, and the 50 μA transfer-function curve corresponds to the behavior when $I_{PD\text{-}DC}$ is 50 μA.

In particular embodiments, a transimpedance amplifier 500 with a DC current-controller circuit 600 as described herein may be referred to as a transimpedance amplifier with automatic current control. In particular embodiments, the automatic current control provided by DC current-controller 600 may result in a different level of DC cancellation current $I_{DC}$ according to the amount of DC input current flowing into transimpedance amplifier 500, where the amount of DC input current refers to the DC portion of photodetector current $I_{PD\text{-}DC}$. In FIG. 8, as the amount of DC input current increases, the low-frequency gain of transimpedance amplifier 500 decreases. For relatively low values of $I_{PD\text{-}DC}$ (e.g., 100 μA), the transfer function at lower frequencies remains relatively flat, indicating that most of the DC current $I_{PD\text{-}DC}$ is allowed to flow into input 520 of transimpedance amplifier 500. When the DC input current is relatively low, DC current controller 600 provides little or no current (e.g., $I_{DC}$ is close to zero), and most of the DC portion of photodetector current $I_{PD\text{-}DC}$ flows into transimpedance amplifier 500. For relatively high values of $I_{PD\text{-}DC}$ (e.g., ≥30 nA), the transfer function at lower frequencies rolls-off, indicating that most of the DC current $I_{PD\text{-}DC}$ is diverted away from input 520 of transimpedance amplifier 500 by DC current controller 600. When the DC input current is relatively high, the DC current controller 600 draws most of the DC input current away from input 520 of transimpedance amplifier 500 (e.g., $I_{DC}$ is approximately equal to $I_{PD\text{-}DC}$), and the amount of DC current flowing into transimpedance amplifier 500 is close to zero. Although this disclosure describes and illustrates particular transfer-function curves having particular low- and high-frequency behavior, this disclosure contemplates any suitable transfer-function curves having any suitable low- and high-frequency behavior.

In particular embodiments, a transimpedance amplifier with automatic current control (e.g., transimpedance amplifier 500 combined with DC current controller 600 as illustrated in FIG. 6 or FIG. 7) may offer the ability to receive and amplify optical-beacon signals 310 as illustrated in FIG. 4 and FIG. 5 and as described herein. During a signal-acquisition process, optical-beacon signal 310 in FIG. 4 may be fairly weak (e.g., since optical beam 300 is spread out, as illustrated in FIG. 2) and may include little or no DC offset 330. In this case, little or no DC-current cancellation is applied (e.g., $I_{DC}$ is approximately zero) since there is little or no DC offset 330 and the input DC current $I_{PD\text{-}DC}$ is relatively low. During a signal-tracking process, optical-beacon signal 310 in FIG. 5 may have a significant DC offset 330 and may be a relatively strong signal. In this case, the DC-current cancellation provided by DC current controller 600 reduces the input DC current that flows into transimpedance amplifier 500 to close to zero (e.g., $I_{DC}$ is approximately equal to $I_{PD\text{-}DC}$). Drawing the DC current away from the transimpedance amplifier 500 increases the dynamic range of the amplifier by preventing the amplifier from becoming saturated by a large DC-offset current.

Previous approaches to receiving and amplifying an optical-beacon signal 310 may include a switchable gain, a bias tee, or a fixed DC servo. A switchable-gain circuit includes a transimpedance gain that can be switched to different values depending on the amount of DC current. However, this approach may exhibit problems associated with hysteresis of the gain stage and disruption to the recovery of an optical beacon signal caused by frequent switching of the gain. A bias tee includes an inductor that filters out the DC current from an input signal. However, this approach may require an inductance value that is quite large, and the bias-tee circuit may become too large or heavy to be practical. Finally, a fixed DC-servo circuit involves subtracting off DC current with a servo circuit that is driven by measuring a DC voltage. However, a fixed DC-servo circuit may include a fixed impedance, and such a circuit suffers from having to make a tradeoff between dynamic range and noise performance. For example, the circuit may offer good dynamic range but poor noise performance (or vice versa). In particular embodiments, a transimpedance amplifier with automatic current control as described and illustrated herein may offer advantages over the above previous approaches in terms of improved noise performance and improved dynamic-range performance. A transimpedance amplifier with automatic current control may be able to receive and amplify signals that are fairly weak (e.g., optical-beacon signal 310 in FIG. 4) without out adding excessive electrical noise to the amplified signals. Additionally, a transimpedance amplifier with automatic current control may be able to receive and amplify signals that are relatively strong and have a significant DC offset 330 (e.g., optical-beacon signal 310 in FIG. 5) without suffering from problems with dynamic range (e.g., saturation of the transimpedance amplifier caused by DC offset 330).

Figure 9:
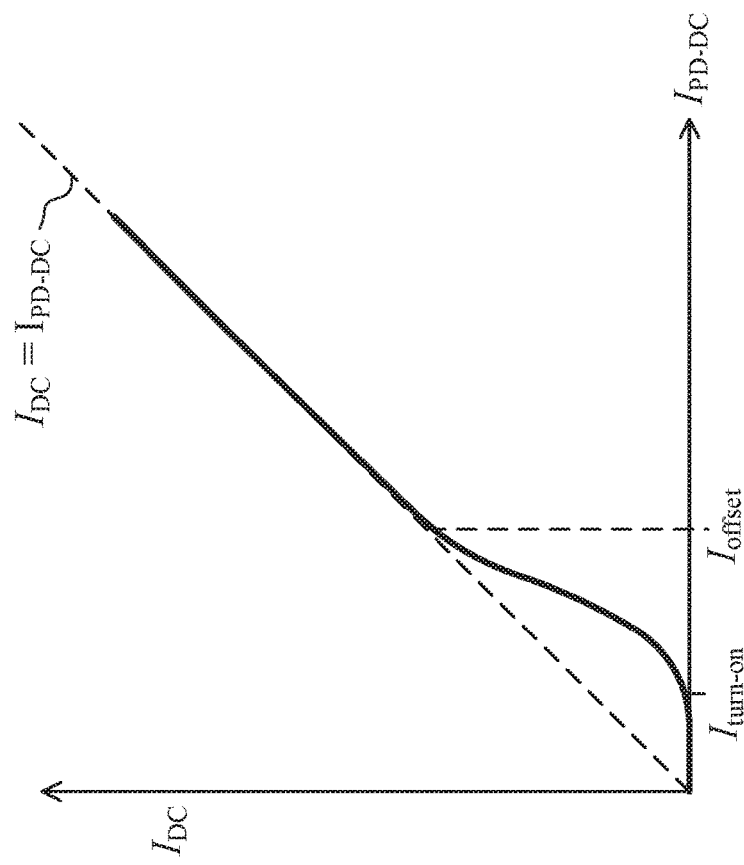
FIG. 9 illustrates an example plot of DC cancellation current ($I_{DC}$) versus the DC portion of the photodetector current ($I_{PD-DC}$).

FIG. 9 illustrates an example plot of DC cancellation current ($I_{DC}$) versus the DC portion of the photodetector current ($I_{PD\text{-}DC}$). The plot of $I_{DC}$ versus $I_{PD\text{-}DC}$ illustrated in FIG. 9 may represent the performance of a transimpedance amplifier with automatic current control (e.g., transimpedance amplifier 500 combined with DC current controller 600 as described herein and illustrated in FIG. 6 and FIG. 7). In particular embodiments, if the DC portion of the photodetector current $I_{PD-DC}$ is greater than or equal to a threshold turn-on current value $I_{turn-on}$, then: the DC cancellation current $I_{DC}$ may be greater than zero; and $I_{DC}$ may be positively correlated with $I_{PD-DC}$. In particular embodiments, $I_{DC}$ being positively correlated with $I_{PD-DC}$ may refer to $I_{DC}$ increasing smoothly or monotonically as $I_{PD-DC}$ increases. In particular embodiments, if the DC portion of the photodetector current $I_{PD-DC}$ is less than $I_{turn-on}$, then the DC cancellation current $I_{DC}$ may be approximately zero. As illustrated in FIG. 9, when $I_{PD-DC}$ is less than $I_{turn-on}$, then $I_{DC}$ is approximately zero. When $I_{PD-DC}$ is relatively low (e.g., $I_{PD-DC} < I_{turn-on}$), current source 620 is turned off, and $I_{DC}$ is approximately zero. When $I_{PD-DC}$ is greater than or equal to $I_{turn-on}$, then $I_{DC}$ is greater than zero, and as $I_{PD-DC}$ increases above $I_{turn-on}$, $I_{DC}$ also increases in a smooth and monotonic manner.

In particular embodiments, if the DC portion of the photodetector current $I_{PD-DC}$ is greater than or equal to a threshold offset current value $I_{offset}$, then the magnitude of the DC cancellation current $I_{DC}$ may be approximately equal to the magnitude of the DC portion of the photodetector current $I_{PD-DC}$. As illustrated in FIG. 9, the dashed 45-degree line corresponds to the state where $I_{DC}$ and $I_{PD-DC}$ are equal, and when $I_{PD-DC} \geq I_{offset}$, then $I_{DC} \cong I_{PD-DC}$. When $I_{PD-DC} \geq I_{offset}$, the DC cancellation current $I_{DC}$ is configured to divert substantially all of the DC portion of the photodetector current $I_{PD-DC}$ away from input 520 of the transimpedance amplifier 500 so that the sum of the two currents $I_{DC}$ and $I_{PD-DC}$ at input 520 is approximately zero (e.g., the magnitude of $I_{DC}$ and the magnitude of $I_{PD-DC}$ are approximately equal). Additionally, the input electrical-current signal $I_{input}$ received at input 520 is approximately equal to the AC portion of the photodetector current $I_{PD-AC}$ since most of the DC portion of the photodetector current $I_{PD-DC}$ is diverted away from input 520 by DC current controller 600. In particular embodiments, DC current controller 600 may be configured so that $I_{turn-on}$ has any suitable value (e.g., 100 pA, 200 pA, 500 pA, 1 nA, 5 nA, 10 nA, or 100 nA) and $I_{offset}$ has any suitable value (e.g., 0.5 µA, 1 µA, 2 µA, or 5 µA). As an example and not by way of limitation, $I_{turn-on}$ may be approximately 200 pA, and when $I_{PD-DC}$ is less than 200 pA, then $I_{DC}$ is approximately zero. As another example and not by way of limitation, $I_{offset}$ may be approximately 1 µA, and when $I_{PD-DC}$ is greater than or equal to 1 µA, then $I_{DC}$ is approximately equal to $I_{PD-DC}$. Although this disclosure describes and illustrates particular plots of $I_{DC}$ versus $I_{PD-DC}$ having particular turn-on currents and particular offset currents, this disclosure contemplates any suitable plots of $I_{DC}$ versus $I_{PD-DC}$ having any suitable turn-on currents and any suitable offset currents.

In particular embodiments, a current being approximately zero may refer to the current being less than a particular percentage of another related current. As an example and not by way of limitation, $I_{DC}$ being approximately zero may refer to $I_{DC}$ being less than 0.1%, 0.5%, 1%, or 2% of $I_{PD-DC}$, or less than any suitable percentage of $I_{PD-DC}$. As another example and not by way of limitation, if $I_{PD-DC}$ is 100 pA, then $I_{DC}$ being approximately zero may refer to $I_{DC}$ being less than or equal to 1 pA. In particular embodiments, two currents being approximately equal may refer to two currents that are within a particular percentage of one another. As an example and not by way of limitation, $I_{DC}$ being approximately equal to $I_{PD-DC}$ may refer to $I_{DC}$ being within 0.1%, 0.5%, 1%, or 2% of $I_{PD-DC}$, or within any suitable percentage of $I_{PD-DC}$. As another example and not by way of limitation, if $I_{PD-DC}$ is 10 µA, then $I_{DC}$ being approximately equal to $I_{PD-DC}$ may refer to $I_{DC}$ being within 0.5% of 10 µA so that $I_{PD-DC}$ is between 9.95 µA and 10.05 µA. In particular embodiments, the DC cancellation current $I_{DC}$ being configured to divert substantially all of $I_{PD-DC}$ away from input 520 may refer to $I_{DC}$ being within a particular percentage of $I_{PD-DC}$. As an example and not by way of limitation, $I_{DC}$ may be within 0.1%, 0.5%, 1%, or 2% of $I_{PD-DC}$, or within any suitable percentage of $I_{PD-DC}$ when $I_{DC}$ is configured to divert substantially all of $I_{PD-DC}$ away from input 520. In particular embodiments, a magnitude of a current or a voltage may refer to an absolute value of the current or voltage. As an example and not by way of limitation, when $I_{DC}$ is configured to divert substantially all of $I_{PD-DC}$ away from input 520, $I_{DC}$ and $I_{PD-DC}$ may have magnitudes that are approximately equal (e.g., $I_{DC} \cong I_{PD-DC}$), but their relative directions (e.g., with respect to input 520) may be different so that when the two currents are combined or summed at input 520, they add up to approximately zero.

In particular embodiments, if the DC portion of the photodetector current $I_{PD-DC}$ is less than the threshold turn-on current value $I_{turn-on}$, then at least part of DC current controller 600 may be electrically isolated from input 520 of the transimpedance amplifier 500. In particular embodiments, having at least part of DC current controller 600 electrically isolated from input 520 may refer to approximately zero electrical noise generated by the DC current controller 600 propagating to input 520 of the transimpedance amplifier 500. As an example and not by way of limitation, when $I_{PD-DC}$ is less than $I_{turn-on}$, then current source 620 (e.g., transistor Q1 illustrated in FIG. 7) may be switched off so that $I_{DC}$ is approximately zero and DC current controller 600 is electrically isolated from input 520. Additionally, since transistor Q1 is switched off, any electrical noise generated by resistor R4, op-amp U2, or any other electrical component of DC current controller 600 may be at least partially blocked by transistor Q1 and may not propagate to input 520. In particular embodiments, DC current controller 600 being electrically isolated from input 520 may refer to DC current controller 600 contributing less than 0.1%, 0.5%, 1%, 2%, or less than any suitable percentage to the total electrical noise of output signal $V_{out}$. As an example and not by way of limitation, if output signal $V_{out}$ has a root-mean-square (RMS) noise amplitude of 100 mV, then DC current controller 600 being electrically isolated from input 520 may refer to DC current controller 600 contributing less than 1% (e.g., less than 1 mV) to the 100-mV noise of $V_{out}$.

In particular embodiments, when the DC current controller 600 is electrically isolated from input 520, the electrical noise imparted to output signal $V_{out}$ may be dominated by resistor R1, the feedback resistor of transimpedance amplifier 500, and a negligible amount of noise may be contributed by DC current controller 600. In this case, which may be used in a signal-acquisition process to receive a relatively weak optical signal having little or no DC offset 330 (e.g., optical signal 310 in FIG. 4), the transimpedance amplifier 500 may provide a relatively low-noise transimpedance amplification of input current signal $I_{input}$. In particular embodiments, when DC current controller 600 is not electrically isolated from input 520, the DC current controller 600 may contribute a non-negligible amount of noise (e.g., from current $I_{DC}$ flowing through 70-k resistor R4) to the output signal $V_{out}$. As an example and not by way of limitation, when DC current controller 600 is providing current $I_{DC}$ to input 520, the electrical noise on output signal $V_{out}$ may increase by 10-20 dB relative to the electrical noise when DC current controller 600 is electrically isolated from input 520. In this case, which may be used in a signal-tracking process to receive a relatively strong optical signal having a significant DC offset 330 (e.g., optical signal 310 in FIG. 5), the DC current controller 600 may provide a DC cancellation current $I_{DC}$ to divert or remove most of $I_{PD-DC}$ from input current $I_{input}$. The optical signal amplitude $P_{peak2}$ in a signal-tracking process may be approximately 103 to 105 times larger than the optical signal amplitude $P_{peak1}$ in a signal-acquisition process. In a signal-tracking process, although the noise amplitude on $V_{out}$ may increase (e.g., by approximately 15 dB), the signal amplitude of $V_{out}$ may increase by a much larger amount (e.g., by 103 to 105 times), which more than compensates for the 15-dB noise increase.

Figure 10:
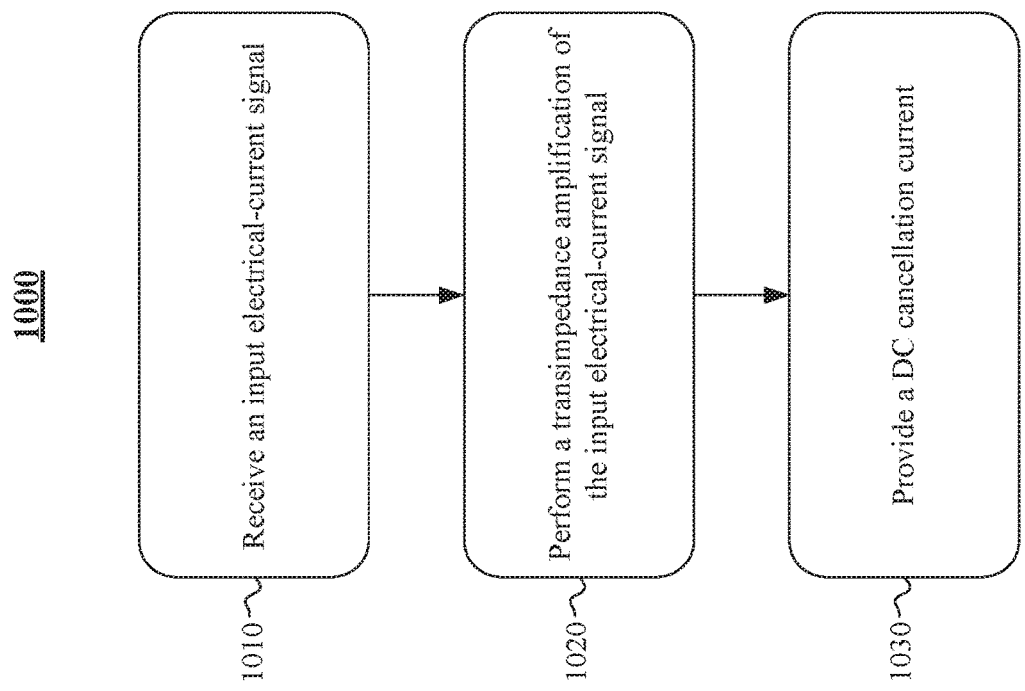
FIG. 10 illustrates an example method for performing transimpedance amplification with automatic current control.

FIG. 10 illustrates an example method 1000 for performing transimpedance amplification with automatic current control. In particular embodiments, method 1000 may be performed by an optical receiver 220 that includes a transimpedance amplifier 500 and a DC current controller 600. In particular embodiments, method 100 may be used in part of a free-space optical-communications link 150 for signal acquisition and signal tracking. The method may begin at step 1010, where an input electrical-current signal $I_{input}$ is received. As an example and not by way of limitation, an input electrical-current signal $I_{input}$ may be received at an input 520 of a transimpedance amplifier 500. The input electrical-current signal $I_{input}$ may include a photodetector current $I_{PD}$ and a DC cancellation current $I_{DC}$. The photodetector current $I_{PD}$ may correspond to an input optical signal 310 and may include an AC portion $I_{PD-AC}$ and a DC portion $I_{PD-DC}$. At step 1020, a transimpedance amplification of the input electrical-current signal $I_{input}$ may be performed. As an example and not by way of limitation, the transimpedance amplification may be performed by a transimpedance amplifier 500, which may produce, at an output 530 of the transimpedance amplifier 500, an output voltage signal $V_{out}$ corresponding to the input electrical-current signal $I_{input}$. At step 1030, a DC cancellation current $I_{DC}$ may be provided. As an example and not by way of limitation, the DC current controller 600 may be coupled to input 520 and output 530 of the transimpedance amplifier 500, and the DC current controller 600 may provide the DC cancellation current $I_{DC}$ to the input 520 of the transimpedance amplifier 500. In particular embodiments, the DC cancellation current $I_{DC}$ may be based on the output voltage signal $V_{out}$. Particular embodiments may repeat one or more steps of the method of FIG. 10, where appropriate. Although this disclosure describes and illustrates particular steps of the method of FIG. 10 as occurring in a particular order, this disclosure contemplates any suitable steps of the method of FIG. 10 occurring in any suitable order. Moreover, although this disclosure describes and illustrates an example method for performing transimpedance amplification with automatic current control including the particular steps of the method of FIG. 10, this disclosure contemplates any suitable method for performing transimpedance amplification with automatic current control including any suitable steps, which may include all, some, or none of the steps of the method of FIG. 10, where appropriate. Furthermore, although this disclosure describes and illustrates particular components, devices, or systems carrying out particular steps of the method of FIG. 10, this disclosure contemplates any suitable combination of any suitable components, devices, or systems carrying out any suitable steps of the method of FIG. 10.

Figure 11:
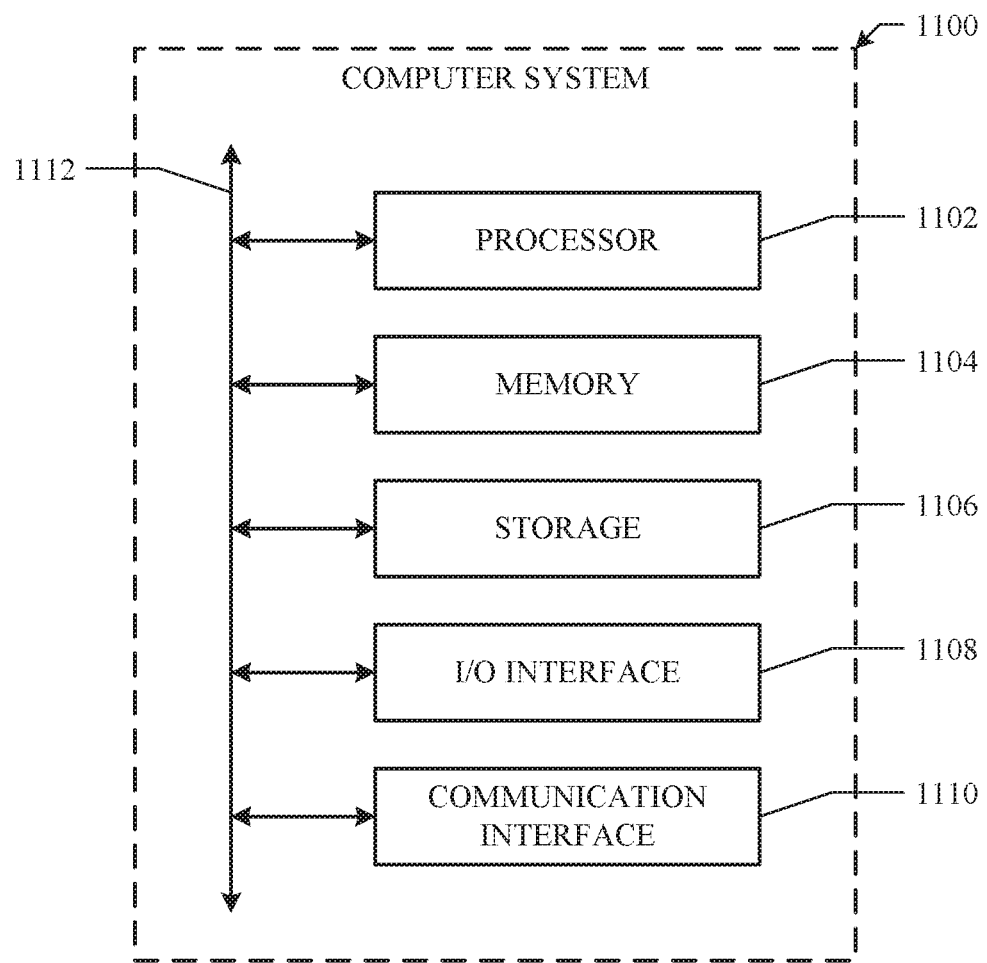
FIG. 11 illustrates an example computer system.

FIG. 11 illustrates an example computer system 1100. In particular embodiments, one or more computer systems 1100 perform one or more steps of one or more methods described or illustrated herein. In particular embodiments, one or more computer systems 1100 provide functionality described or illustrated herein. In particular embodiments, software running on one or more computer systems 1100 performs one or more steps of one or more methods described or illustrated herein or provides functionality described or illustrated herein. Particular embodiments include one or more portions of one or more computer systems 1100. Herein, reference to a computer system may encompass a computing device, and vice versa, where appropriate. Moreover, reference to a computer system may encompass one or more computer systems, where appropriate.

This disclosure contemplates any suitable number of computer systems 1100. This disclosure contemplates computer system 1100 taking any suitable physical form. As example and not by way of limitation, computer system 1100 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1100 may include one or more computer systems 1100; be unitary or distributed; span multiple locations; span multiple machines; span multiple data centers; or reside in a cloud, which may include one or more cloud components in one or more networks. Where appropriate, one or more computer systems 1100 may perform without substantial spatial or temporal limitation one or more steps of one or more methods described or illustrated herein. As an example and not by way of limitation, one or more computer systems 1100 may perform in real time or in batch mode one or more steps of one or more methods described or illustrated herein. One or more computer systems 1100 may perform at different times or at different locations one or more steps of one or more methods described or illustrated herein, where appropriate.

In particular embodiments, computer system 1100 includes a processor 1102, memory 1104, storage 1106, an input/output (I/O) interface 1108, a communication interface 1110, and a bus 1112. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1102 includes hardware for executing instructions, such as those making up a computer program. As an example and not by way of limitation, to execute instructions, processor 1102 may retrieve (or fetch) the instructions from an internal register, an internal cache, memory 1104, or storage 1106; decode and execute them; and then write one or more results to an internal register, an internal cache, memory 1104, or storage 1106. In particular embodiments, processor 1102 may include one or more internal caches for data, instructions, or addresses. This disclosure contemplates processor 1102 including any suitable number of any suitable internal caches, where appropriate. As an example and not by way of limitation, processor 1102 may include one or more instruction caches, one or more data caches, and one or more translation lookaside buffers (TLBs). Instructions in the instruction caches may be copies of instructions in memory 1104 or storage 1106, and the instruction caches may speed up retrieval of those instructions by processor 1102. Data in the data caches may be copies of data in memory 1104 or storage 1106 for instructions executing at processor 1102 to operate on; the results of previous instructions executed at processor 1102 for access by subsequent instructions executing at processor 1102 or for writing to memory 1104 or storage 1106; or other suitable data. The data caches may speed up read or write operations by processor 1102. The TLBs may speed up virtual-address translation for processor 1102. In particular embodiments, processor 1102 may include one or more internal registers for data, instructions, or addresses. This disclosure contemplates processor 1102 including any suitable number of any suitable internal registers, where appropriate. Where appropriate, processor 1102 may include one or more arithmetic logic units (ALUs); be a multi-core processor; or include one or more processors 1102. Although this disclosure describes and illustrates a particular processor, this disclosure contemplates any suitable processor.

In particular embodiments, memory 1104 includes main memory for storing instructions for processor 1102 to execute or data for processor 1102 to operate on. As an example and not by way of limitation, computer system 1100 may load instructions from storage 1106 or another source (such as, for example, another computer system 1100) to memory 1104. Processor 1102 may then load the instructions from memory 1104 to an internal register or internal cache. To execute the instructions, processor 1102 may retrieve the instructions from the internal register or internal cache and decode them. During or after execution of the instructions, processor 1102 may write one or more results (which may be intermediate or final results) to the internal register or internal cache. Processor 1102 may then write one or more of those results to memory 1104. In particular embodiments, processor 1102 executes only instructions in one or more internal registers or internal caches or in memory 1104 (as opposed to storage 1106 or elsewhere) and operates only on data in one or more internal registers or internal caches or in memory 1104 (as opposed to storage 1106 or elsewhere). One or more memory buses (which may each include an address bus and a data bus) may couple processor 1102 to memory 1104. Bus 1112 may include one or more memory buses, as described below. In particular embodiments, one or more memory management units (MMUs) reside between processor 1102 and memory 1104 and facilitate accesses to memory 1104 requested by processor 1102. In particular embodiments, memory 1104 includes random access memory (RAM). This RAM may be volatile memory, where appropriate Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1104 may include one or more memories 1104, where appropriate. Although this disclosure describes and illustrates particular memory, this disclosure contemplates any suitable memory.

In particular embodiments, storage 1106 includes mass storage for data or instructions. As an example and not by way of limitation, storage 1106 may include a hard disk drive (HDD), a floppy disk drive, flash memory, an optical disc, a magneto-optical disc, magnetic tape, or a Universal Serial Bus (USB) drive or a combination of two or more of these. Storage 1106 may include removable or non-removable (or fixed) media, where appropriate. Storage 1106 may be internal or external to computer system 1100, where appropriate. In particular embodiments, storage 1106 is non-volatile, solid-state memory. In particular embodiments, storage 1106 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1106 taking any suitable physical form. Storage 1106 may include one or more storage control units facilitating communication between processor 1102 and storage 1106, where appropriate. Where appropriate, storage 1106 may include one or more storages 1106. Although this disclosure describes and illustrates particular storage, this disclosure contemplates any suitable storage.

In particular embodiments, I/O interface 1108 includes hardware, software, or both, providing one or more interfaces for communication between computer system 1100 and one or more I/O devices. Computer system 1100 may include one or more of these I/O devices, where appropriate. One or more of these I/O devices may enable communication between a person and computer system 1100. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1108 for them. Where appropriate, I/O interface 1108 may include one or more device or software drivers enabling processor 1102 to drive one or more of these I/O devices. I/O interface 1108 may include one or more I/O interfaces 1108, where appropriate. Although this disclosure describes and illustrates a particular I/O interface, this disclosure contemplates any suitable I/O interface.

In particular embodiments, communication interface 1110 includes hardware, software, or both providing one or more interfaces for communication (such as, for example, packet-based communication) between computer system 1100 and one or more other computer systems 1100 or one or more networks. As an example and not by way of limitation, communication interface 1110 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1110 for it. As an example and not by way of limitation, computer system 1100 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1100 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1100 may include any suitable communication interface 1110 for any of these networks, where appropriate. Communication interface 1110 may include one or more communication interfaces 1110, where appropriate. Although this disclosure describes and illustrates a particular communication interface, this disclosure contemplates any suitable communication interface.

In particular embodiments, bus 1112 includes hardware, software, or both coupling components of computer system 1100 to each other. As an example and not by way of limitation, bus 1112 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1112 may include one or more buses 1112, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising:
receiving, at an input of a transimpedance amplifier, an input electrical-current signal comprising:
a photodetector current corresponding to an input optical signal, wherein the photodetector current comprises an alternating-current (AC) portion and a direct-current (DC) portion; and
a DC cancellation current;
performing, by the transimpedance amplifier, a transimpedance amplification of the input electrical-current signal to produce, at an output of the transimpedance amplifier, an output voltage signal corresponding to the input electrical-current signal, wherein the output voltage signal produced at the output of the transimpedance amplifier is analyzed to wirelessly provide feedback information, via a free-space optical link, to an optical transmitter for one of signal acquisition or signal tracking, and wherein the feedback information that is wirelessly provided to the optical transmitter for signal tracking comprises information to adjust aiming of an optical beam for maintaining incidence of the optical beam on an optical receiver; and
providing, by a current-control circuit coupled to the input and the output of the transimpedance amplifier, the DC cancellation current to the input of the transimpedance amplifier, wherein the DC cancellation current is adjusted based on (1) the output voltage signal by the transimpedance amplifier and (2) whether the feedback information to the optical transmitter is to be used for one of signal acquisition or signal tracking, and wherein if the feedback information to the optical transmitter is to be used for signal tracking, then the DC cancellation current is increased to divert the DC portion of the photodetector current away from the input of the transimpedance amplifier.

2. The method of claim 1, wherein:
if the DC portion of the photodetector current is greater than or equal to a threshold turn-on current value, then:
the DC cancellation current is greater than zero; and
the DC cancellation current is positively correlated with the DC portion of the photodetector current, wherein as the DC portion of the photodetector current increases above the threshold turn-on value, the DC cancellation current also increases;
else:
the DC cancellation current is approximately zero.

3. The method of claim 2, wherein if the DC portion of the photodetector current is less than the threshold turn-on current value, then at least part of the current-control circuit is electrically isolated from the input of the transimpedance amplifier, wherein approximately zero electrical noise generated by the current-control circuit propagates to the input of the transimpedance amplifier.

4. The method of claim 2, wherein the DC cancellation current is configured to divert at least part of the DC portion of the photodetector current away from the input of the transimpedance amplifier.

5. The method of claim 1, wherein if the DC portion of the photodetector current is greater than or equal to a threshold offset current value, then:

a magnitude of the DC cancellation current is approximately equal to a magnitude of the DC portion of the photodetector current;

the DC cancellation current is configured to divert substantially all of the DC portion of the photodetector current away from the input of the transimpedance amplifier, wherein a sum of the DC cancellation current and the DC portion of the photodetector current is approximately zero; and the input electrical-current signal received at the input of the transimpedance amplifier is approximately equal to the AC portion of the photodetector current.

6. The method of claim 1, further comprising, by a photodetector coupled to the input of the transimpedance amplifier:

receiving the input optical signal, the input optical signal comprising a time-varying portion and a substantially constant portion; and producing the photodetector current corresponding to the received input optical signal, wherein:

the time-varying portion of the received input optical signal corresponds to the AC portion of the photodetector current; and the substantially constant portion of the received input optical signal corresponds to the DC portion of the photodetector current.

7. The method of claim 1, wherein the output voltage signal comprises an AC-voltage portion and a DC-voltage portion, the AC-voltage portion corresponding to the AC portion of the photodetector current, and the DC-voltage portion corresponding to a sum of the DC portion of the photodetector current and the DC cancellation current, and further comprising:

producing, by the current-control circuit, the DC cancellation current, wherein the DC cancellation current is based on the DC-voltage portion of the output voltage signal.

8. The method of claim 1, wherein the DC cancellation current has a direction, with respect to the transimpedance amplifier input, that is opposite a direction of the DC portion of the photodetector current.

9. The method of claim 1, wherein the transimpedance amplifier has a transimpedance gain of approximately $10^5$ volts per ampere to approximately $10^7$ volts per ampere.

10. The method of claim 1, wherein the current-control circuit comprises a filtering circuit and a current-source circuit, wherein:

the filtering circuit is configured to receive the output voltage signal from the output of the transimpedance amplifier and produce a control voltage based on the output voltage signal; and the current-source circuit is configured to receive the control voltage from the filtering circuit and produce the DC cancellation current based on the received control voltage.

11. The method of claim 10, wherein the filtering circuit comprises an operational amplifier configured to operate as an integrator.

12. The method of claim 10, wherein the filtering circuit comprises an operational amplifier configured to operate as a low-pass filter.

13. The method of claim 10, wherein the current-source circuit comprises a transistor, wherein:

a first terminal of the transistor is configured to receive the control voltage;

a second terminal of the transistor is coupled to a resistor; and a third terminal of the transistor is coupled to the input of the transimpedance amplifier.

14. The method of claim 1, wherein:

if the feedback information to the optical transmitter is to be used for signal acquisition, then the DC cancellation current is decreased to allow the DC portion of the photodetector current to the input of the transimpedance amplifier.

15. A system comprising:

a transimpedance amplifier configured to:

receive, at an input of the transimpedance amplifier, an input electrical-current signal comprising:

a photodetector current corresponding to an input optical signal, wherein the photodetector current comprises an alternating-current (AC) portion and a direct-current (DC) portion; and a DC cancellation current; and perform a transimpedance amplification of the input electrical-current signal to produce, at an output of the transimpedance amplifier, an output voltage signal corresponding to the input electrical-current signal, wherein the output voltage signal produced at the output of the transimpedance amplifier is analyzed to wirelessly provide feedback information, via a free-space optical link, to an optical transmitter for one of signal acquisition or signal tracking, and wherein the feedback information that is wirelessly provided to the optical transmitter for signal tracking comprises information to adjust aiming of an optical beam for maintaining incidence of the optical beam on an optical receiver; and a current-control circuit coupled to the input and the output of the transimpedance amplifier, the current-control circuit configured to provide the DC cancellation current to the input of the transimpedance amplifier, wherein the DC cancellation current is adjusted based on (1) the output voltage signal by the transimpedance amplifier and (2) whether the feedback information to the optical transmitter is to be used for one of signal acquisition or signal tracking, and wherein if the feedback information to the optical transmitter is to be used for signal tracking, then the DC cancellation current is increased to divert the DC portion of the photodetector current away from the input of the transimpedance amplifier.

16. The system of claim 15, wherein:

if the DC portion of the photodetector current is greater than or equal to a threshold turn-on current value, then:

the DC cancellation current is greater than zero; and the DC cancellation current is positively correlated with the DC portion of the photodetector current, wherein as the DC portion of the photodetector current increases above the threshold turn-on value, the DC cancellation current also increases;

else:

the DC cancellation current is approximately zero.

17. The system of claim 16, wherein:

if the DC portion of the photodetector current is less than the threshold turn-on current value, then at least part of the current-control circuit is electrically isolated from the input of the transimpedance amplifier, wherein approximately zero electrical noise generated by the current-control circuit propagates to the input of the transimpedance amplifier.

18. The system of claim 16, wherein the DC cancellation current is configured to divert at least part of the DC portion of the photodetector current away from the input of the transimpedance amplifier.

19. The system of claim 15, wherein if the DC portion of the photodetector current is greater than or equal to a threshold offset current value, then:
- a magnitude of the DC cancellation current is approximately equal to a magnitude of the DC portion of the photodetector current;
- the DC cancellation current is configured to divert substantially all of the DC portion of the photodetector current away from the input of the transimpedance amplifier, wherein a sum of the DC cancellation current and the DC portion of the photodetector current is approximately zero; and
- the input electrical-current signal received at the input of the transimpedance amplifier is approximately equal to the AC portion of the photodetector current.

20. The system of claim 15, wherein the current-control circuit comprises a filtering circuit and a current-source circuit, wherein:
- the filtering circuit is configured to receive the output voltage signal from the output of the transimpedance amplifier and produce a control voltage based on the output voltage signal; and
- the current-source circuit is configured to receive the control voltage from the filtering circuit and produce the DC cancellation current based on the received control voltage.

* * * * *